(12) United States Patent
Biswas et al.

(10) Patent No.: US 9,508,854 B2
(45) Date of Patent: Nov. 29, 2016

(54) SINGLE FIELD EFFECT TRANSISTOR CAPACITOR-LESS MEMORY DEVICE AND METHOD OF OPERATING THE SAME

(71) Applicant: ECOLE POLYTECHNIQUE FEDERALE DE LAUSANNE (EPFL), Lausanne (CH)

(72) Inventors: Arnab Biswas, Ecublens (CH); Nilay Dagtekin, Lausanne (CH); Mihai Adrian Ionescu, Ecublens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/507,487

(22) Filed: Oct. 6, 2014

(65) Prior Publication Data
US 2015/0179800 A1 Jun. 25, 2015

(30) Foreign Application Priority Data
Dec. 6, 2013 (WO) .................. PCT/IB2013/060708

(51) Int. Cl.
| | |
|---|---|
| G11C 7/22 | (2006.01) |
| H01L 29/78 | (2006.01) |
| H01L 27/12 | (2006.01) |
| H01L 27/108 | (2006.01) |
| G11C 11/404 | (2006.01) |

(52) U.S. Cl.
CPC ......... *H01L 29/7855* (2013.01); *G11C 11/404* (2013.01); *H01L 27/10802* (2013.01); *H01L 27/10879* (2013.01); *H01L 27/1211* (2013.01); *G11C 2211/4016* (2013.01)

(58) Field of Classification Search
CPC ............... H01L 29/7855; H01L 27/10879; H01L 27/10802; H01L 27/1211; G11C 11/404; G11C 2211/4016
USPC ....... 365/51, 63, 186, 187, 189.011; 257/66, 257/288, 347
See application file for complete search history.

(56) References Cited

U.S. PATENT DOCUMENTS

| | | |
|---|---|---|
| 3,171,042 A | 2/1965 | Matare |
| 6,111,288 A | 8/2000 | Watanabe et al. |

(Continued)

FOREIGN PATENT DOCUMENTS

| | | |
|---|---|---|
| EP | 0488677 | 6/1992 |
| EP | 0631326 | 12/1994 |

(Continued)

OTHER PUBLICATIONS

Abele et al., "Suspended-Gate MOSFET: bringing new MEMS functionality into solid-state MOS transistor," IEEE, 2005, 3 pages.

(Continued)

*Primary Examiner* — Tha-O H Bui
(74) *Attorney, Agent, or Firm* — Sheridan Ross P.C.

(57) ABSTRACT

A single field effect transistor capacitor-less memory device, and method of operating the same, including a drain region, a source region, an intrinsic channel region between the drain region and the source region forming the single field effect transistor and a base. The device further includes a fin structure comprising the source region, the intrinsic channel and the drain region, the fin structure extending outwardly from the base, and a double gate comprising a first gate connected to a first exposed lateral face of the intrinsic channel region for transistor control, and a second gate connected to a second exposed lateral face of the intrinsic channel region to generate a potential well for storing mobile charge carriers permitting memory operation, the first gate and the second gate being asymmetric for asymmetric electrostatic control of the device.

20 Claims, 15 Drawing Sheets

(56) References Cited

U.S. PATENT DOCUMENTS

| | | | |
|---|---|---|---|
| 6,548,848 | B2 | 4/2003 | Horiguchi et al. |
| 6,621,725 | B2 | 9/2003 | Ohsawa |
| 6,825,524 | B1 | 11/2004 | Ikehashi et al. |
| 7,476,939 | B2 | 1/2009 | Okhonin et al. |
| 8,384,122 | B1 | 2/2013 | Hu et al. |
| 2002/0000592 | A1 | 1/2002 | Fujiwara |
| 2003/0198087 | A1 | 10/2003 | Kinsey et al. |
| 2004/0021166 | A1 | 2/2004 | Hyde et al. |
| 2005/0224800 | A1* | 10/2005 | Lindert ............ H01L 29/66795 257/66 |
| 2007/0138530 | A1* | 6/2007 | Okhonin ............... G11C 11/404 257/301 |
| 2007/0138539 | A1 | 6/2007 | Wu et al. |
| 2008/0130379 | A1 | 6/2008 | Ohsawa |
| 2009/0108322 | A1 | 4/2009 | Widjaja |
| 2009/0108351 | A1* | 4/2009 | Yang ..................... H01L 27/108 257/347 |
| 2009/0238008 | A1 | 9/2009 | Horch |
| 2010/0034041 | A1 | 2/2010 | Widjaja |
| 2010/0046287 | A1 | 2/2010 | Widjaja |
| 2010/0246277 | A1 | 9/2010 | Widjaja et al. |
| 2010/0315884 | A1 | 12/2010 | Toh et al. |
| 2011/0032756 | A1 | 2/2011 | Widjaja |
| 2012/0115297 | A1 | 5/2012 | Huang et al. |
| 2013/0069122 | A1 | 3/2013 | Wan et al. |

FOREIGN PATENT DOCUMENTS

| | | |
|---|---|---|
| EP | 0843360 | 5/1998 |
| EP | 1091418 | 4/2001 |
| EP | 2568507 | 3/2013 |

OTHER PUBLICATIONS

Appenzeller et al., "Band-to-Band Tunneling in Carbon Nanotube Field-Effect Transistors," American Physical Society Physical Review Letters, 2004, vol. 93(19), pp. 196805-1-196805-4.

Arimoto et al., "Current Status of Ferroelectric Random-Access Memory," MRS Bulletin, Nov. 2004, pp. 823-828.

Ban et al., "A Scaled Floating Body Cell (FBC) Memory with High-k+Metal Gate on Thin-Silicon and Thin-BOX for 16-nm Technology Node and Beyond," IEEE Symposium on VLSI Technology Digest of Technical Papers, 2008, pp. 92-93.

Boucart et al., "Double-Gate Tunnel FET With High-K Gate Dielectric," IEEE Transactions on Electron Devices, 2007, vol. 54(7), pp. 1725-2007.

Campardo et al., "VLSI Design of Non-Volatile Memories," Springer-Verlag Berlin Heidelberg, 2005, retrieved from www.Springer.com, 3 pages.

Chen et al., "Integrated Circuit Design with NEM Relays," IEEE/ACM International Conference on Computer-Aided Design, 2008, 8 pages.

Choi et al., "Tunneling Field-Effect Transistors (TFETs) With Subthreshold Swing (SS) Less Than 60 mV/dec," IEEE Electron Device Letters, 2007, vol. 28(8), pp. 743-745.

Gopalakrishnan et al.,"I-MOS: A Novel Semiconductor Device with a Subthreshold Slope lower than kT/q," IEEE International Electron Devices Meeting, 2002, pp. 289-292.

Han et al., "Programming/Erasing Characteristics of 45 nm NOR-Type Flash Memory Based on SOI FinFET Structure," Journal of the Korean Physical Society, 2005, vol. 47, pp. S564-S567.

Headland, "Hot electron injection," Feb. 19, 2004, retrieved from http://gunn.winterwolf.co.uk/archive/hot_e_inj, 2 pages.

Nishizawa et al., High Speed and High Density Static Induction Transistor Memory, IEEE Journal of Solid State Circuits, 2008, vol. SC-13(5), pp. 622-634.

Ohsawa et al., "An 18.5ns 128Mb SOI DRAM with a Floating Body Cell," IEEE International Solid-State Circuits Conference, 2005, pp. 458-459 and 609.

Ohsawa et al., "Memory Design Using a One-Transistor Gain Cell on SOI," IEEE Journal of Solid-State Circuits, 2002, vol. 37(11), pp. 1510-1522.

Okhonin et al. "A SOI Capacitor-less 1T-DRAM Concept," IEEE International SOI Conference, 2001, pp. 153-154.

Okhonin et al., "A Capacitor-Less 1T-DRAM Cell," IEEE Electron Device Letters, 2002, vol. 23(2), pp. 85-87.

Okhonin, et al., "Principles of Transient Charge Pumping on Partially Depleted SOI MOSFETs," IEEE Electron Device Letters, 2002, vol. 23(5), pp. 279-281.

Pellizzer et al., A 90nm Phase Change Memory Technology for Stand-Alone Non-Volatile Memory Applications, IEEE Symposium on VLSI Technology Digest of Technical Papers, 2006, 12 pages.

Pierret, "Semiconductor Device Fundamentals," excerpts, Addison-Wesley Publishing Company, 1996, 204 pages.

Ranica et al., "Scaled 1T-Bulk devices built with CMOS 90nm technology for low-cost eDRAM applications," Symposium on VLSI Technology Digest of Technical Papers, 2005, pp. 38-39.

Salahuddin et al., "Use of Negative Capacitance to Provide Voltage Amplification for Low Power Nanoscale Devices," Nano Letters, 2008, vol. 8(2), pp. 405-410.

Salvatore et al., "Demonstration of Subthrehold Swing Smaller Than 60m V/decade in Fe-FET with P(VDF-TrFE)/Si02 Gate Stack," IEDM, 2008, 4 pages.

Tack et al., The Multistable Charge-Controlled Memory Effect in SOI Transistors at Low Temperatures, IEEE Transactions on Electron Devices, 1990, vol. 37(5), pp. 1373-1382.

Yoshida et al., "A Design of a Capacitorless 1T-DRAM Cell Using Gate-Induced Drain Leakage (GIDL) Current for Low-power and High-speed Embedded Memory," IEEE International Electron Devices Meeting, 2003, pp. 37.6.1-37.6.4.

Ban et al. "Floating Body cell with Independently-Controlled Double Gates for High Denisty Memory," International Electron Devices Meeting Technical Digest, Dec. 2006, pp. 573-576.

Chatterjee et al. "Circuit Optimization of the Taper Isolated Dynamic Gain RAM Cell for VLSI Memories," ISSCC 79, Feb. 1979, pp. 22-23.

Fazan et al. "A Simple 1-Transistor Capacitor-Less Memory Cell for High Performance Embedded DRAMs," Proceedings of IEEE 2002 Custom Integrated Circuits Conference, May 2002, pp. 99-102.

Ionescu et al. "Tunnel field-effect transistors as energy-efficient electronic switches," Nature, Nov. 2011, vol. 479, No. 7373, pp. 329-337.

Kuo et al. "A Capacitorless Double-Gate DRAM Cell," IEEE Electron Device Letters, Jun. 2002, vol. 23, No. 6, pp. 345-347.

Kuo et al. "A Capacitorless Double Gate DRAM Technology for Sub-100-nm Embedded and Stand-Alone Memory Applications," IEEE Transactions on Electron Devices, Dec. 2003, vol. 50, No. 12, pp. 2408-2416.

Kuo et al. "A Capacitorless Double-Gate DRAM Cell Design for High Density Applications," IEDM Technical Digest, Dec. 2002, pp. 843-846.

Mayer et al. "Impact of SOI, Si1-xGexOI and GeOI substrates on CMOS compatible Tunnel FET performance," IEDM 2008, Dec. 2008, 4 pages.

Ohsawa et al. "Memory Design Using One-Transistor Gain Cell on SOI," ISSCC Dig. Tech. Papers, Feb. 2002, pp. 152-153.

Okhonin et al. "New Generation of Z-RAM," IEDM Technical Digest, Dec. 2007, pp. 925-928.

Padilla et al. "Feedback FET: A Novel Transistor Exhibiting Steep Switching Behavior at Low Bias Voltages," International Electron Devices Meeting Technical Digest, Dec. 2008, 4 pages.

Ranica et al. "A One Transistor Cell on Bulk Substrate (1T-Bulk) for Low-Cost and High Density eDRAM," 2004 Symposium on VLSI Technology Dig. Tech. Papers, Jun. 2004, pp. 128-129.

Sasaki "Charge Pumping in SOS-MOS Transistors," IEEE Transactions on Electron Devices, Jan. 1981, vol. ED-28, No. 1, pp. 48-52.

Wann et al. "A Capacitorless DRAM Cell on SOI Substrate," IEDM Technical Digest, Dec. 1993, pp. 635-638.

Yoshida et al. "A Capacitorless 1T-DRAM Technology Using Gate-Induced Drain-Leakage (GIDL) Current for Low-Power and High-Speed Embedded Memory," IEEE Transactions on Electron Devices, Apr. 2006, vol. 53, No. 4, pp. 692-697.

\* cited by examiner

SINGLE FIELD EFFECT TRANSISTOR CAPACITOR-LESS MEMORY DEVICE AND METHOD OF OPERATING THE SAME

CROSS-REFERENCE TO RELATED APPLICATIONS

This application claims the benefit of International Application No. PCT/IB2013/060708 filed Dec. 6, 2013, the entire contents of which are incorporated herein by reference.

The present invention concerns the field of transistors, in particular the subset which is dedicated to volatile memory design and, more particularly, a single transistor capacitor-less dynamic random access memory device. The invention further relates to methods of operation of the device, a memory cell including the device and an array comprising a plurality of said memory cells. The invention further concerns a method of operating said memory cell array.

In particular, a capacitor-less dynamic random access memory (DRAM) device comprising a double gate p/i/n structure is described as well as methods of operation of said device.

The device and gain cells feature memory like operation thanks to the creation of an energy pocket in a channel region by a pair of gates, each of which has asymmetric electrostatic control. Bit information is stored in the form of charge in the induced potential well and modulates the drain current by changing the potential profile in the body (channel) when the device is on. The device write mechanism is based on carrier drift due to applied electric field (forward biased diode action) and readout is via a band to band tunneling (BTBT) current.

Furthermore, the present invention particularly concerns a capacitor-less dynamic random access memory (DRAM) device including a p+ doped pocket section between a channel and a drain of the device, as well as methods of operation of said device.

BACKGROUND OF THE INVENTION

Gated p/i/n structures, so called tunnel field effect transistors (TFET), are prominent for their abrupt switching behaviour [0] as the injection mechanism is band to band tunneling (BTBT) which consequently liberates them from the 60 mV/dec of sub-threshold slope boundary which is the theoretical limit at room temperature for thermionic injection based FETs. In the present invention, we exploit the presence of reservoirs for both types of carriers (holes and electrons) in an innovative way to realize single transistor DRAM operation.

In conventional metal-oxide-semiconductor (MOS) FET structure (p+/i/+p or n+/i+/n), the desired potential well is inherently available and it is exploited with floating body effect in Z-RAM [0]; however the majority carrier injection to the body requires techniques (i.e. hot carrier injection) which degrade reliability and the device's life time. In a TFET structure, the opposite doping of drain and source regions solves this problem and the challenge of carrier injection becomes one of creation and preservation of a potential well to store the charges.

Tunnelling FETs which are essentially p/i/n structures can be exploited both as P type (PTFET) or N type (NTFET) devices. In both modes of operation (P or N) p-n is reverse-biased. Conventionally, in N type operation, p+ region is used as source, n+ region is used as drain and the gate terminal is biased positively with respect to source allowing electrons to tunnel from source to channel. Similarly for P type operation, p+ region is used as drain, n+ region is used as source and the gate terminal is biased negatively with respect to source allowing holes to tunnel from drain to channel region.

SUMMARY OF THE INVENTION

The present invention relates to a single field effect transistor capacitor-less memory device including a drain region, a source region, an intrinsic channel region between the drain region and the source region forming the single field effect transistor, and a base. The device further includes a fin structure comprising the source region, the intrinsic channel and the drain region, the fin structure extending outwardly from the base, and a double gate comprising a first gate connected to a first exposed lateral face of the intrinsic channel region for transistor control, and a second gate connected to a second exposed lateral face of the intrinsic channel region to generate a potential well for storing mobile charge carriers permitting memory operation, the first gate and the second gate being asymmetric for asymmetric electrostatic control of the device.

The first gate and the second gate are connected to the intrinsic channel region asymmetrically one respect to the other for asymmetric electrostatic control of the device.

The device is a four terminal device comprising a first gate terminal, a second gate terminal, a drain terminal and a source terminal. The device is a N-type or P-type device.

The present invention also relates to a method for operating the above device wherein, when the device is a N-type device, a potential well is generated for storing mobile charge carriers permitting memory operation by biasing the second gate with a negative voltage. A first write '1' operation is carried out by applying a positive bias to the source region to forward bias the source region/intrinsic channel region junction to push charge carriers to the generated potential well. A second write '0' operation is carried out by applying a zero bias or positive bias to the second gate to remove the generated potential well. A memory state holding operation is carried by applying a zero bias to the source region and a negative bias to the second gate to hold any excess charge.

A memory state reading operation is carried out using band to band tunneling of carriers from the source region to the intrinsic channel region The reading operation is carried out by applying device operating voltage $V_{DD}$ to the drain region and the first gate at a value permitting bending of the energy bands such that tunneling occurs at the source channel junction beneath the first gate.

In the case where the device is P-type, a potential well for storing mobile charge carriers permitting memory operation is generated by biasing the second gate with a positive voltage. The first write operation is carried out by applying a negative bias to the source region to forward bias the source region/intrinsic channel region junction to provide charge carriers to the generated potential well. The second write operation is carried out by applying a zero bias or negative bias to the second gate to remove the generated potential well. The holding operation involves applying a zero bias to the source region and a positive bias to the second gate to hold any excess charge. The reading operation is also carried out by applying the device operating voltage $V_{DD}$ to the drain region and the first gate G1 at a value permitting bending of the energy bands such that tunneling occurs at the source channel junction beneath the first gate.

The invention also concerns a single field effect transistor capacitor-less memory device including a drain region, a source region, an intrinsic channel region between the drain region and the source region forming the single field effect transistor, and a base. The device further includes a carrier potential well section, connected between the intrinsic channel region and the drain region, for storing mobile charge carriers permitting memory operation, a fin structure comprising the source region, the intrinsic channel, the carrier potential well section and the drain region, the fin structure extending outwardly from the base as well as a tri-gate straddling the intrinsic channel region for electrostatic control of the device.

A memory operation method of the above device includes carrying out a first write operation of a first memory state by applying a first bias voltage to the drain region and a second bias voltage of opposite sign and smaller magnitude than that of the first bias voltage to the tri-gate to populate a potential well with mobile charge carriers.

A second write operation or an erase operation involves applying a third bias voltage opposite in sign to that of the first biasing voltage to the drain and applying a fourth bias voltage of opposite sign and smaller magnitude than that of the third bias voltage to the tri-gate to remove mobile charge carriers.

A memory state holding operation is carried out by applying a zero bias to the drain region and a hold voltage of the same sign as that of the third biasing voltage but higher in magnitude than the third biasing voltage to the tri-gate to hold charge carriers in the potential well.

A memory state reading operation is carried out using band to band tunneling of carriers. A positive device operating voltage $V_{DD}$ is applied to the drain region and to the tri-gate at a value permitting bending of the transistor energy bands such that tunneling occurs.

DETAILED DESCRIPTION OF THE INVENTION

Figure 1:
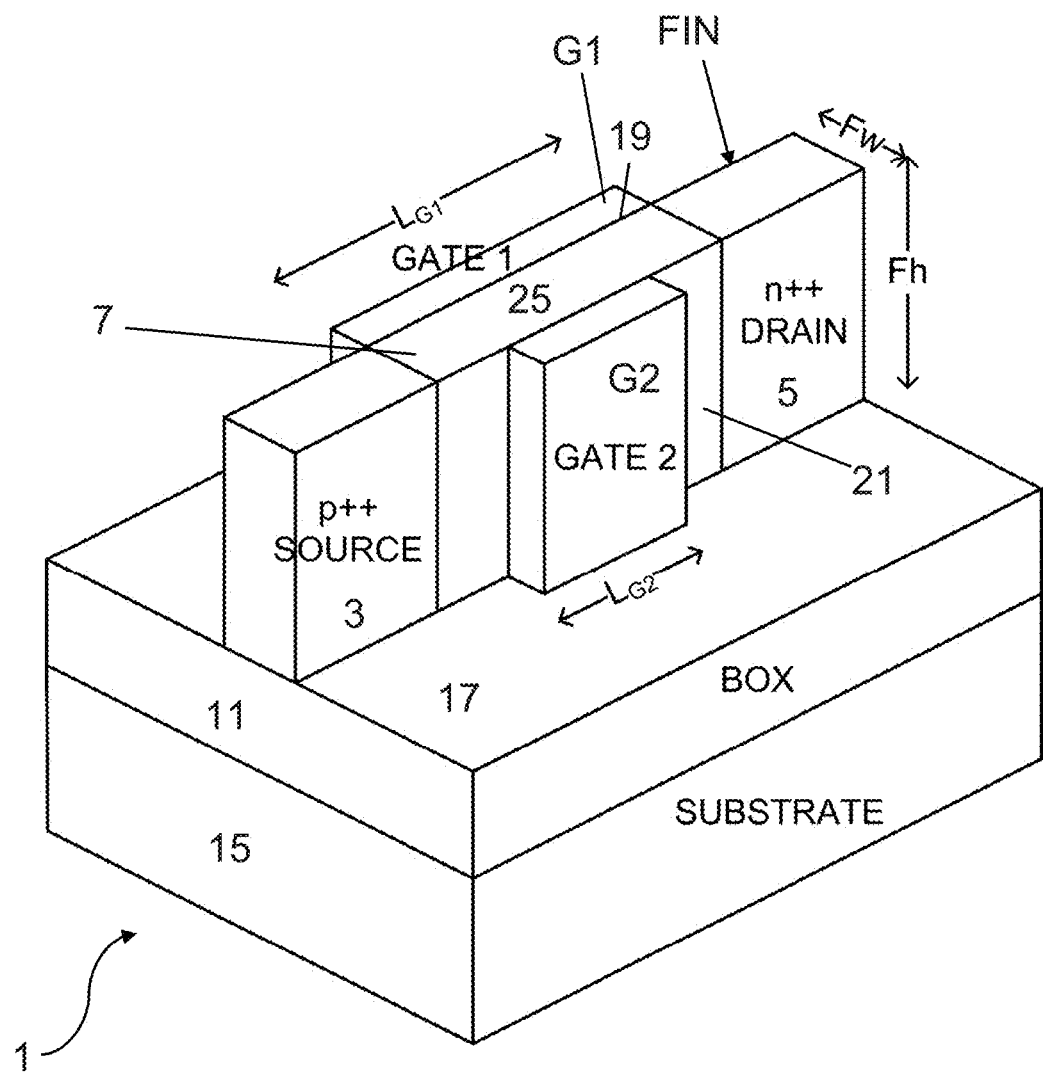
FIG. 1 illustrates a three dimensional double gate FIN N-type tunneling field effect transistor (3D DG FIN NTFET (n type)) structure with partial side gate according to the present invention.

FIG. 1 illustrates a device 1 according to a first embodiment of the present invention. The device 1 is a three dimensional Double Gate FIN N-type Tunnelling Field Effect Transistor (3D DG FIN NTFET) structure with a partial side gate. The device includes a non-planar, double-gate transistor built on an SOI or silicon substrate, that is, a FIN double-gate transistor built on an SOI or silicon substrate.

The device 1 includes a fin structure (FIN) and the device 1 is a non-planer structure. The fin structure comprises a source region 3, a drain region 5, an intrinsic channel region 7 between the drain region 5 and the source region 3 and connected to said source and drain regions, a first gate Gate1 (G1) connected to the intrinsic channel region 7 for transistor control, and a second gate Gate2 (G2) connected to the intrinsic channel region 7 to generate a potential well for storing mobile charge carriers to permit memory operation.

The device 1 further includes a BOX (Buried oxide) layer 11 from which the fin structure projects outwardly, and substrate 15 comprising a silicon (Si) layer or a silicon on insulator (SOI) layer (Si/insulator/Si substrate).

The source 3, channel 7 and drain 5 all project outwardly from the device upper surface 17 and are raised above the surface 17 of the BOX layer 11. The fin structure extends out from the surface 17 of the BOX layer 11 to form a structure protruding from a base that is the BOX layer 11. In the exemplary embodiment, the device has a substantially inverted 'T' shape.

The channel 7 extends outwardly from the Box layer 11 and includes a first face 19 and a second face 21, each of which is substantially perpendicular to the surface 17 of the BOX layer 11. The first 19 and second face 21 are substantially parallel to each other. The channel 7 further includes a top surface 23 interconnecting the first 19 and second face 21. The top surface 23 extends substantially parallel to the surface 17 of the BOX layer 11.

The first gate G1 is connected to the first face 19 and substantially fully covers first face 19 of the channel. The second gate G2 is connected to the second face 21 and only partially covers the second face 21 of the channel 7. The top surface 23 is gate-less. A thin gate oxide layer (not-illustrated) is present between the gate G1 and the first face 19 of the channel 7 as well as between the second gate G2 and the second face 21 of the channel 7.

The gates G1 and G2 are asymmetric in shape and/or length. The channel 7 has a length that extends in a direction interconnecting the source and drain regions. The first gate G1 has a length $L_{G1}$ that is substantially the same as the length of the channel 7. The second gate G2 has a length $L_{G2}$ that is shorter than length $L_{G1}$ and shorter than the length of the channel 7.

In the illustrated embodiment of FIG. 1, the gate G2 is positioned so as to be substantially centred along the length of the channel 7. However, the gate G2 does not have to be centred. However, gate G2 should also not be positioned too close to the source region 3 as this will hamper the formation of a potential well.

For example, the fin structure width Fw=30 nm, the fin structure height Fh=65 nm, the first gate G1 length $L_{G1}$=100 nm and the second gate G2 length $L_{G2}$=30 nm.

The device 1 of FIG. 1 is an N-type device, that is, the source region 3 is (doped) p-type and the drain region is (doped) n-type.

However, it should be understood that the present invention equally applies to a P-type device, that is, the source region 3 is (doped) n-type and the drain region is (doped) p-type. A p+ region is used as drain, a n+ region is used as the source and the gate is biased negatively with respect to source allowing holes to tunnel from drain to channel region.

The proposed memory operation of the present invention applies to both N and P type operation with the requirement of inversing the sign of the biasing voltages.

The memory operation of the device 1 is verified using Sentaurus TCAD calculations/simulations performed on the gated p+/i/n+ structure as illustrated in FIG. 1.

A key feature of the one or single transistor (1T) capacitor-less Tunnel FET DRAM device 1 is the possibility to create a potential well that is used to store charges injected from the source-to-body (intrinsic channel 7) junction when the Gate 2 (G2) is in accumulation while the Gate 1 (G1) is in inversion (and/or depletion) as shown in FIG. 2 (b).

Figure 2A:
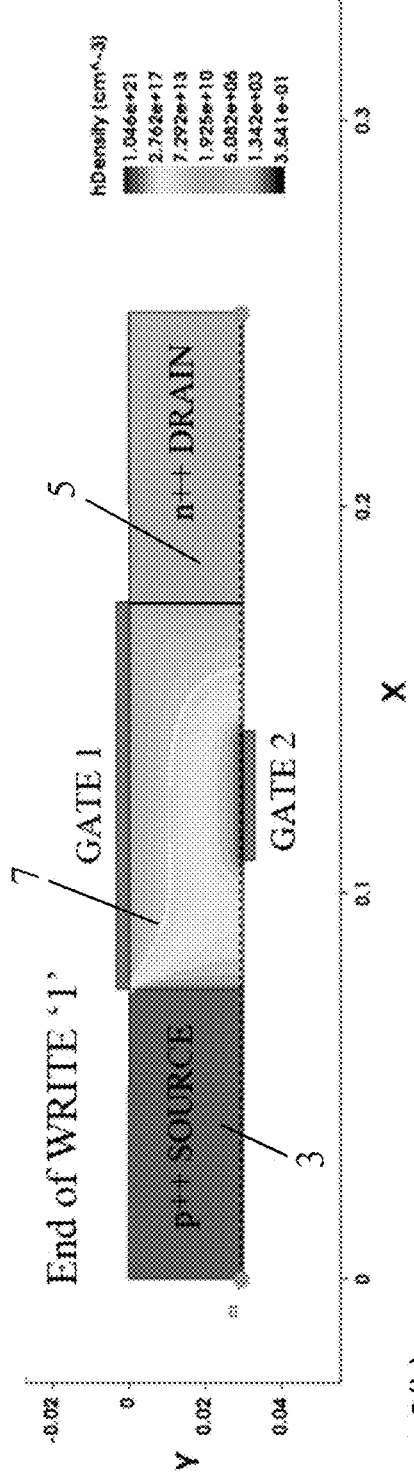
FIG. 2(a) illustrates a 2D cross-section of the DG-FIN-NTFET device of FIG. 1 showing the hole density at the end of a write "1" operation.
Figure 2B:
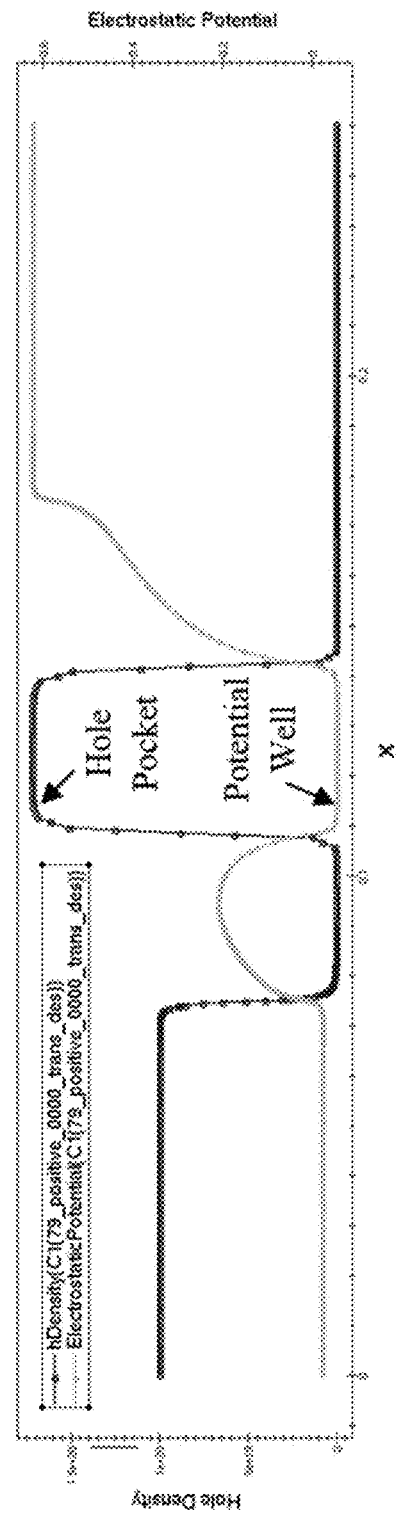
FIG. 2(b) shows hole density and electrostatic potential at a cross section 1 nm in front of Gate 2 showing the formation of a potential well/hole pocket.

FIG. 2(a) illustrates a 2D cross-section of the DG-FIN-NTFET device 1 of FIG. 1 showing the hole density at the end of a write "1" operation. FIG. 2(b) shows hole density and electrostatic potential at a cross section 1 nm in front of Gate 2 showing the formation of a potential well/hole pocket.

The majority carriers of the source terminal (holes in NTFET, electrons in PTFET) are injected by forward-biasing source-channel junction which will significantly improve the device reliability as compared to DRAM cells that depend on impact ionization phenomena. As the TFET turns on with the inversion of the control gate Gate 1, depending on the presence or absence of excess carriers in the potential well, different 'on' current levels are obtained due to a floating body effect.

Figure 4A:
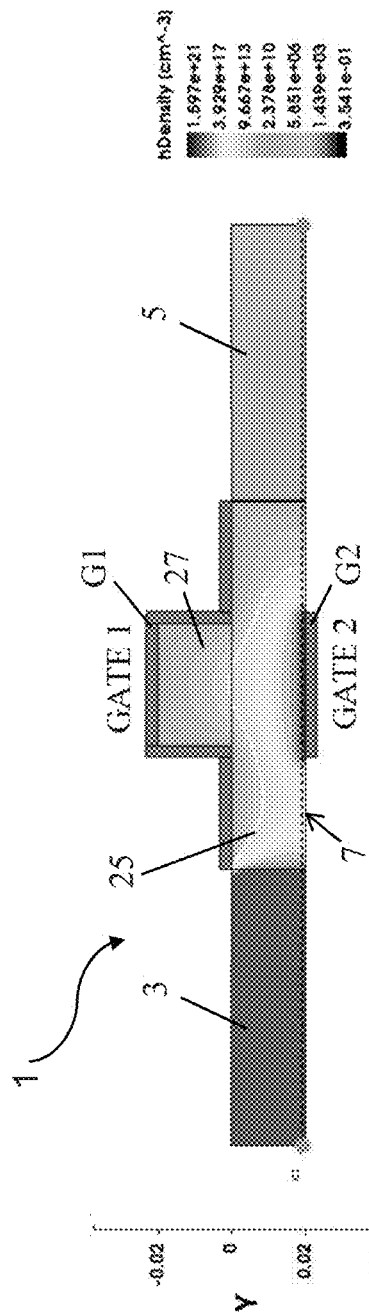
FIG. 4(a) illustrates a 2D cross-section of a device according to another embodiment of the present invention concerning a DG NTFET implementation showing the hole density during a write "1" operation.
Figure 4B:
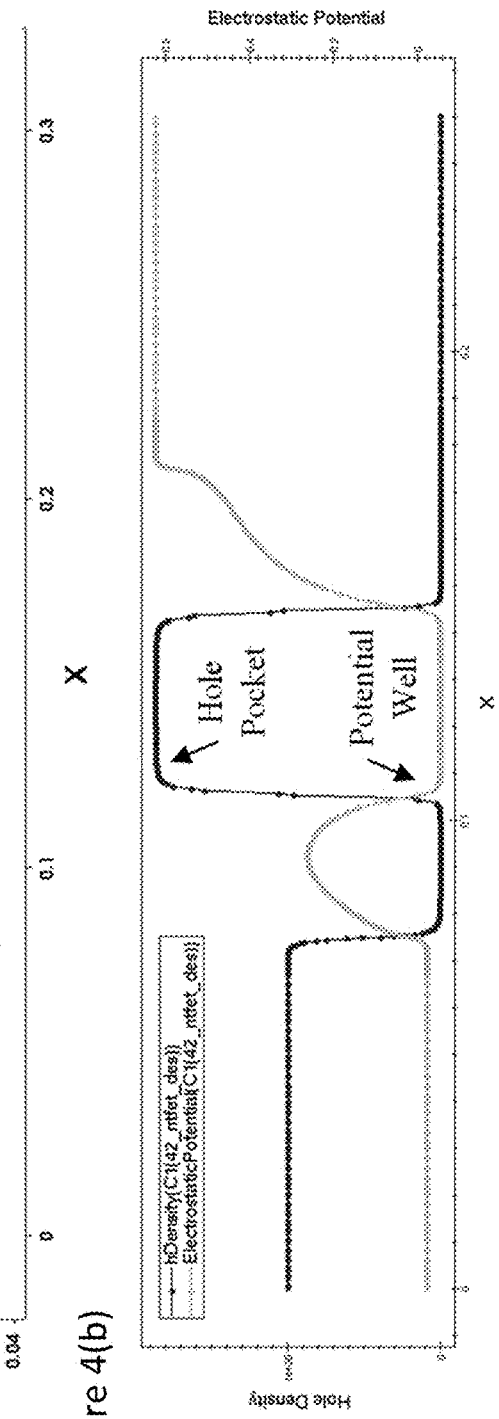
FIG. 4(b) illustrates hole density and electrostatic potential at a cross section 1 nm in front of Gate 2, for a quasi-planar double gate NTFET (2D) device structure, showing the formation of potential well/hole pocket.
Figure 5:
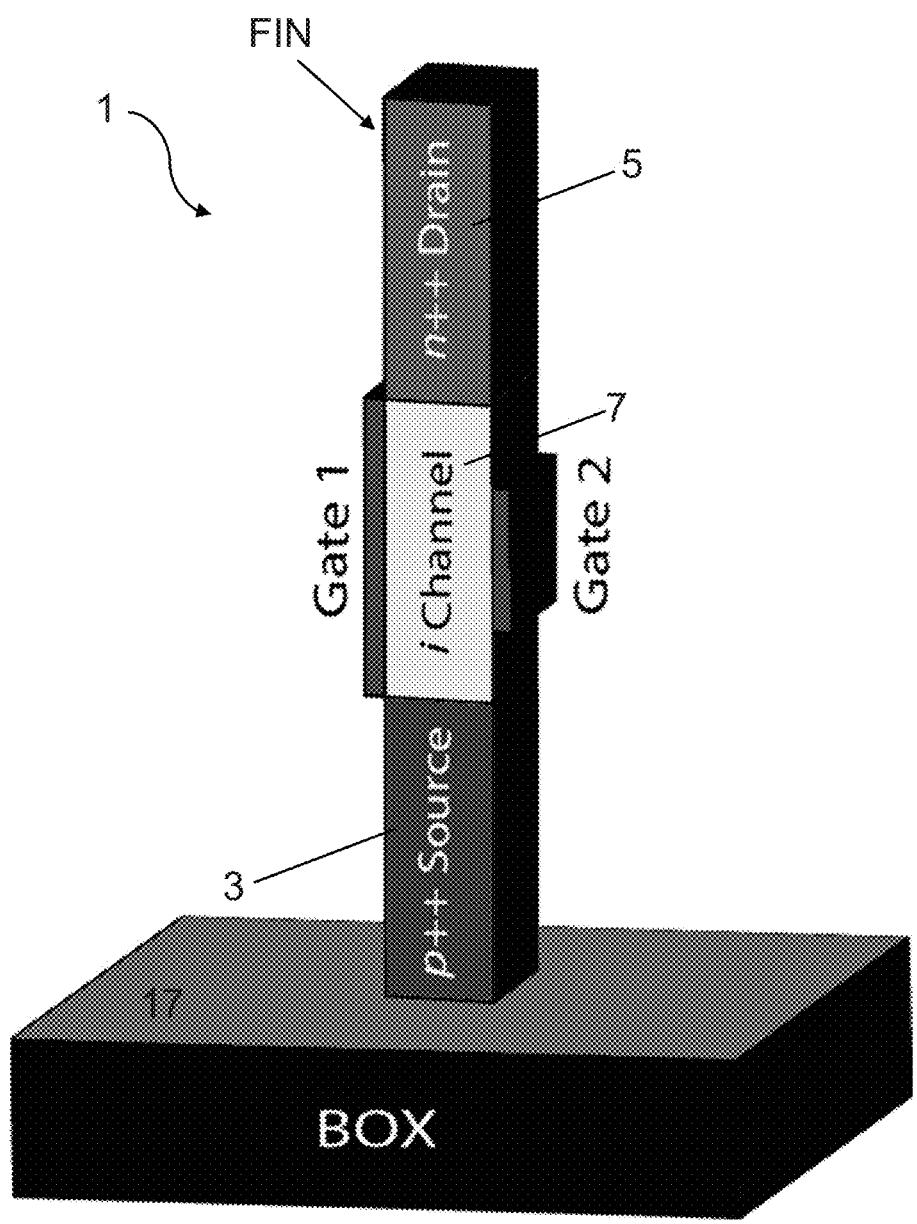
FIG. 5 illustrates a Vertical NTFET structure according to a further embodiment of the present invention.
Figure 6:
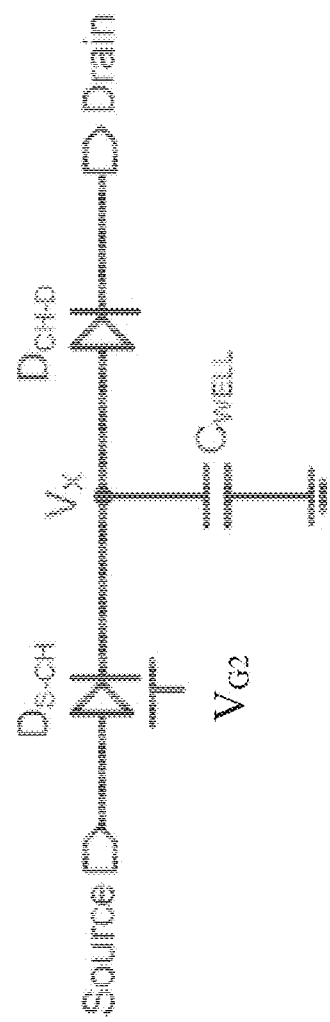
FIG. 6 shows a circuit representation of the FET device according to the present invention controlled by Gate 2 to illustrate a write "1" operation.

In particular, viability of the following optimized memory device structures were verified using simulations in TCAD: the Double gated FIN-NTFET as illustrated in FIG. 1, the double gate NTFET as illustrated in FIG. 4, a quasi-planar double gate NTFET (2D) device structure and the vertical NTFET structure as illustrated in FIG. 5.

Double Gated FIN-NTFET Device Structure:

As mentioned above, the double gate (DG) fin NTFET device 1 includes a partial vertical side gate (G2) as shown in FIG. 1. Gate G1 covers the entire channel and is used for standard transistor control. One role of the gate G2 is to hold the excess charges in the intrinsic channel 7 (body) with a small negative bias. It is known that, for efficient TFET transistor operation, a fully depleted body is required. However for charge storage in the intrinsic channel 7 (body), partial depletion is preferable. Hence, the chosen fin width Fw is the parameter which manages the trade-off between optimum electrostatic control of the gate G1 and the ability to store charges. Calculation results show that a fin width Fw in the range 30 to 50 nm (including 30 and 50 nm) are optimum and preferred.

The double gate (DG)-FIN-NTFET device 1 can be fabricated on both bulk as well as on SOI (Si/insulator/Si substrate) wafers. It is noted that in the case where bulk silicon is used, the source 3-to-body 15 junction of the device 1 provides charges to the potential well formed by gate G2. In the case where SOI is used, the source 3-to-channel 7 junction of the device 1 provides charges to the potential well formed by gate G2.

A source/drain doping of $1 \times 10^{20}$ cm$^{-3}$ of Boron/Arsenic was used. The channel 7 is an intrinsic channel or very lightly doped. A 3 nm layer of HfO$_2$ gate oxide was used for both Gate G1 and Gate G2. The Gate length ($L_{G1}$) is 100 nm and a silicon thickness of the fin width Fw is 30 nm for all calculations unless otherwise specified. Abrupt doping profiles were assumed.

The operation of memory device 1 is based on the creation of an induced potential well achieved by biasing gate G2 with a negative potential. A small positive bias on the source 3 can be used to flood the intrinsic channel 7 (body) with excess holes. These excess holes are then trapped in the potential well close to gate G2 as shown in FIG. 2(a). FIG. 2(b) shows hole density and electrostatic potential at a cross section 1 nm in front of/above gate G2. As the device 1 is turned on, the presence or absence of the excess carriers in the potential well affects the read current read out of the device and produces two different memory states.

The following programming scheme or method is used for operation of the memory device 1:

(a) WRITE '1': The write "1" step involves biasing the p++ source 3 with a small positive voltage, together with a negative bias on gate G2. This causes holes from the source to drift (by forward biased diode action) into the intrinsic channel 7 (body) which are then trapped in the induced potential well generated by gate G2 as shown in FIG. 2(*b*). The following are the values used in the calculations to perform this operation: $V_{G1}$=0V, $V_{G2}$=-2V, $V_S$=0.5V, $V_D$=0V.

(b) WRITE '0'/ERASE: in the write "0" (or erase) step, a zero or a small positive bias is applied to the gate G2 (<1V). This removes any induced potential well from the previous state and the holes in the body diffuse back to the source 3 or recombine to the drain 5. The following are the values used in the calculations to perform this operation: $V_{G1}$=0V, $V_{G2}$=1V, $V_S$=-0.25V, $V_D$=0V.

(c) HOLD: After the write '1' or '0' step the source 3 goes back to zero bias and the negative bias on gate G2 (-2V) holds on to excess charge (if any) in the channel 7 (body). The following are the values used in the calculations to perform this operation: $V_{G1}$=0V, $V_{G2}$=-2V, $V_S$=0V, $V_D$=0V.

(d) READ: The readout operation is carried out via band to band tunneling BTBT from the p+ source 3 to the intrinsic channel 7. For this, both drain 5 and gate G1 are biased at a device operating voltage ($V_{DD}$) which is sufficiently high to bend the energy bands such that tunneling occurs. Depending on the design of a peripheral circuit (current amplifier etc.) and the device characteristics, exact biasing values can be optimized. The Source 3 remains at zero bias for the read operation. The control of gate G1 on the read out current is affected by the presence or absence of excess carriers in the channel 7 (body). The following are the values used in the calculations to perform this operation: $V_{G1}$=2V, $V_{G2}$=-2V, $V_S$=0V, $V_D$=1V.

The entire operation methods are summarized in Table:

TABLE I

| Programming scheme for device 1 | | | | |
|---|---|---|---|---|
| State | $V_D$ [V] | $V_{G1}$ [V] | $V_{G2}$ [V] | $V_S$ [V] |
| WRITE 1 | 0 | 0 | Negative bias to induce potential well/ accumulation of holes | Small positive bias to push hole into the body |
| WRITE 0 (ERASE) | 0 | 0 | Zero or a small positive bias | Small negative bias to aid the erase process |
| HOLD | 0 | 0 | Negative bias to maintain potential well | 0 |
| READ | $V_{DD}$ | $V_{DD}$ | Negative bias to maintain potential well | 0 |

Figure 3A:
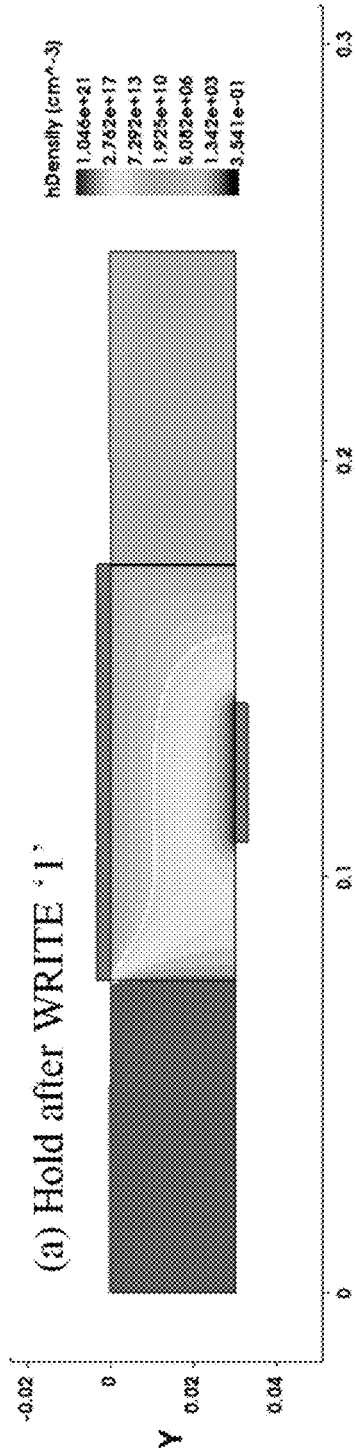
FIG. 3(a) shows transient calculations/simulations showing hole densities in the device of FIG. 1 in a HOLD state after a WRITE '1' operation.
Figure 3B:
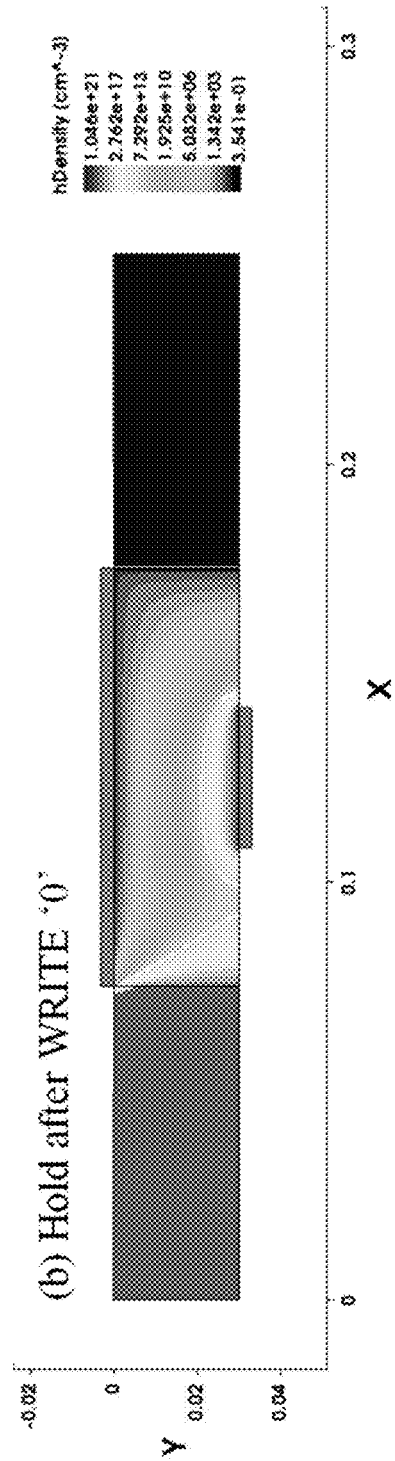
FIG. 3(b) shows transient calculations/simulations showing hole densities in the device of FIG. 1 in a HOLD state after a WRITE '0' operation.

In addition, transient simulations were carried out to observe the hole density in the channel 7 (body) in HOLD mode preceded by a WRITE "1" operation and a WRITE "0" operation. FIG. 3(*a*) shows hole densities in the device 1 of FIG. 1 in a HOLD state after a WRITE' operation and FIG. 3(*b*) shows hole densities in the device 1 of FIG. 1 in a HOLD state after a WRITE '0' operation.

A clear difference is present showing that more holes are stored under the gate G1 after WRITE '1' compared to after WRITE '0' state. Now, when the device is turned on, the presence or absence of these excess carriers affects the read-out current of the device 1 producing two different memory states. The difference in the hole density in the channel 7 (body) after a WRITE "1" or WRITE "0" operation causes a difference in read-out current.

Double gate NTFET (2D) device structure: In another embodiment of the present invention, as illustrated in FIG. 4(*a*), the device 1 is the same as the device illustrated in FIG. 1 except that the intrinsic channel 7 no longer has a substantially rectangular cross-sectional shape but has instead a cross sectional shape in the form of a 'T'. The intrinsic channel 7 comprises an elongated section 25 extending between the source 3 and drain 5, as well as a projection/raised body 27 protruding from section 25 in a direction substantially perpendicular to elongation of section 25. The first gate G1 is no longer planar but now has a top-hat cross-sectional shape and covers the first face 19 as previously described with respect to the device of FIG. 1. Moreover, in this present embodiment, the second gate G2 can alternatively substantially entirely cover the second face 21 of the channel 7 because the asymmetrical gate shapes permit device operation.

The middle part of the channel 7 is raised by 40 nm on one side so as to have a partial depletion condition. The rest of the channel 7 is fully depleted at 20 nm, which is preferable for a good transistor operation. The write "1" step is similar to the device of FIG. 1; a small positive bias is applied to the source 3, which floods the channel 7 (body) with excess holes. A negative bias on gate G2 is then used to hold these charges in the raised body 27. The write "0" step necessitates putting a zero or positive bias to the bottom gate G2. This causes the holes in the channel 7 (body) to return to the source 3. When the device turns on again, the presence or absence of excess holes in the body affects the read-out current of the device 1. Two distinct memory states are again produced.

In another embodiment, the device 1 can be implemented as a quasi-planar DG NTFET device structure. In this case, the device 1 does not have a FINFET structure illustrated in FIG. 1 but has a structure in which the source 3, channel 7 and drain 5 are formed as a planar layer on the BOX layer 11 of FIG. 1, the device having a bulk silicon substrate layer in contact with the BOX layer 11. The above mentioned features described with respect to FIG. 4(*a*) such as the projection/raised body 27 is here also present on the outer exposed surface of the channel 7 to which gate G1 illustrated in FIG. 4(*a*) is in contact. Gate 2 is formed on or by the outer surface of the bulk Si layer on the opposite end of the device. FIG. 4(*b*) illustrates hole density and electrostatic potential at a cross section 1 nm in front of Gate 2 of FIG. 4(*b*), for a quasi-planar double gate NTFET (2D) device structure, showing the formation of potential well/hole pocket.

Vertical NTFET Structure:

In a further embodiment of the present invention, the DG-FIN-NTFET device 1 comprises a vertical fin structure FIN as shown in FIG. 5. The device 1 is the same as that of FIG. 1 except the fin structure project vertically upwards form the BOX layer 11. Only, the source region 3 is in physical contact with the BOX layer 11 (and the body of the device) and the channel 7 and drain region 5 respectively extend vertically outwards from the source region 3. The memory device operation principle remains the same as discussed previously for the devices of the other embodiments.

Figure 9:
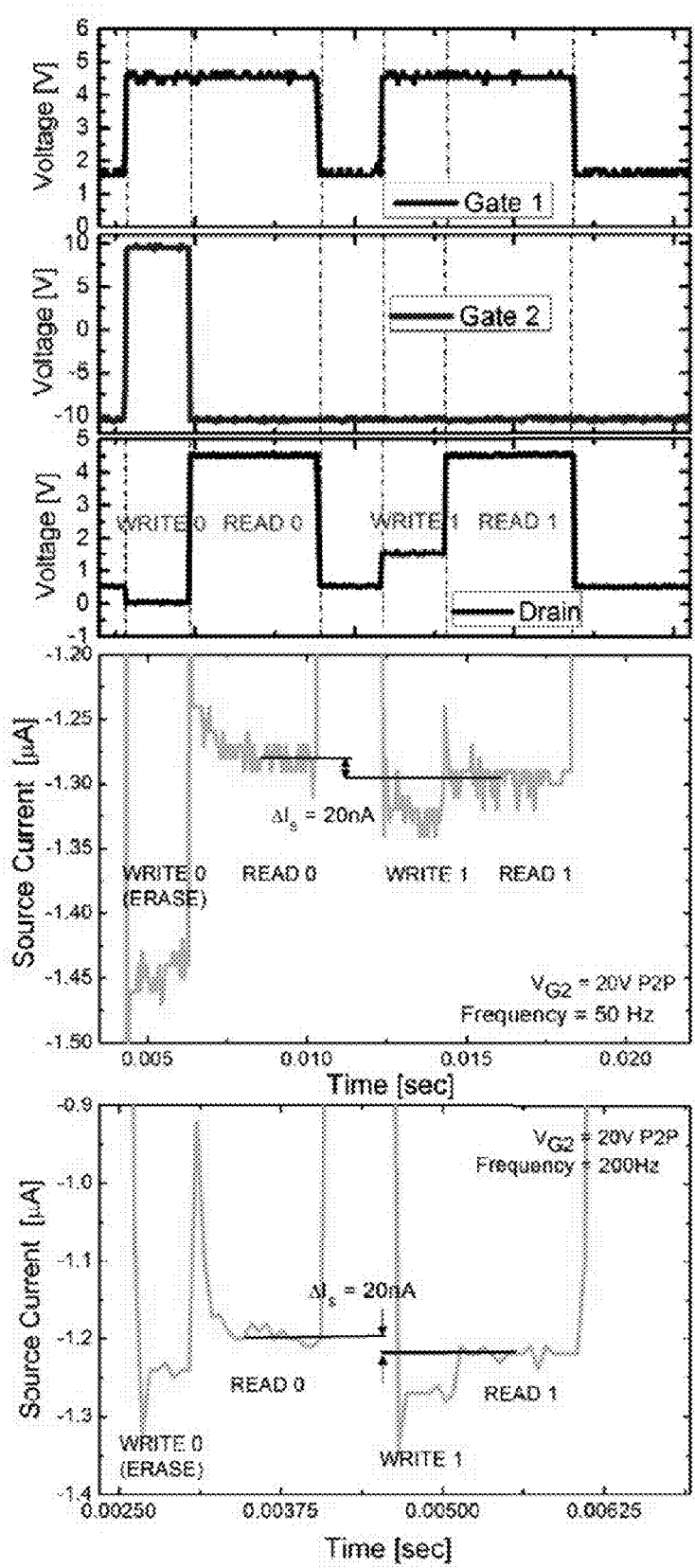
FIG. 9 shows measured consecutive ERASE (or WRITE-0)/READ and WRITE-1/READ operations measured from the NTFET device of FIG. 7 (with $L_G$=400 nm, $L_{IN}$=200 nm), the source current was sampled every 60 μs with a constant voltage of 500 mV and, as shown, a memory effect is observed, and based on the previous WRITE-1/ERASE (or WRITE-0) state a difference of 20 nA in the READ current ($I_S$) for states '1' and '0' is observed, where the measurements were done at two different frequencies 50 Hz and 200 Hz.

A circuit representation providing an insight of the charge storage is depicted in FIG. 9. The mobile charge carriers (hole or electron) are going to be stored on the $C_{WELL}$ capacitor which represents the potential well and hence affect the transfer characteristic of the TFET as gate G1 is used as the control gate by modifying its threshold voltage. The presence and the capacitance depends on numerous parameters such as biasing conditions, doping levels and the degree of control difference among the two gate terminals. In FIG. 9, $V_X$ represents the potential of an internal node in the body, not an external terminal.

The main advantages of TFET based single transistor DRAM device 1 are as follows:
Having no capacitor renders the proposed memory cell device outstandingly favourable for scalability goals as compared to conventional DRAM cell with trench/stack capacitor,
For the same reason the complexity and cost of the fabrication is reduced,
In contrast with the SOI Z-RAM® there is no need of impact ionization to create/inject the charges into the device body/channel, the charges are being injected by the forward-bias source/channel (p/i in N type, n/i in P type) junction, which will improve the device reliability significantly,
As the read-out operation is based on BTBT, the read access time is not degraded by temperature due to weak temperature dependence of tunneling current,
The very low $I_{OFF}$ is offering low to zero refresh rate, hence a reduction in power consumption is provisioned.

Figure 7A:
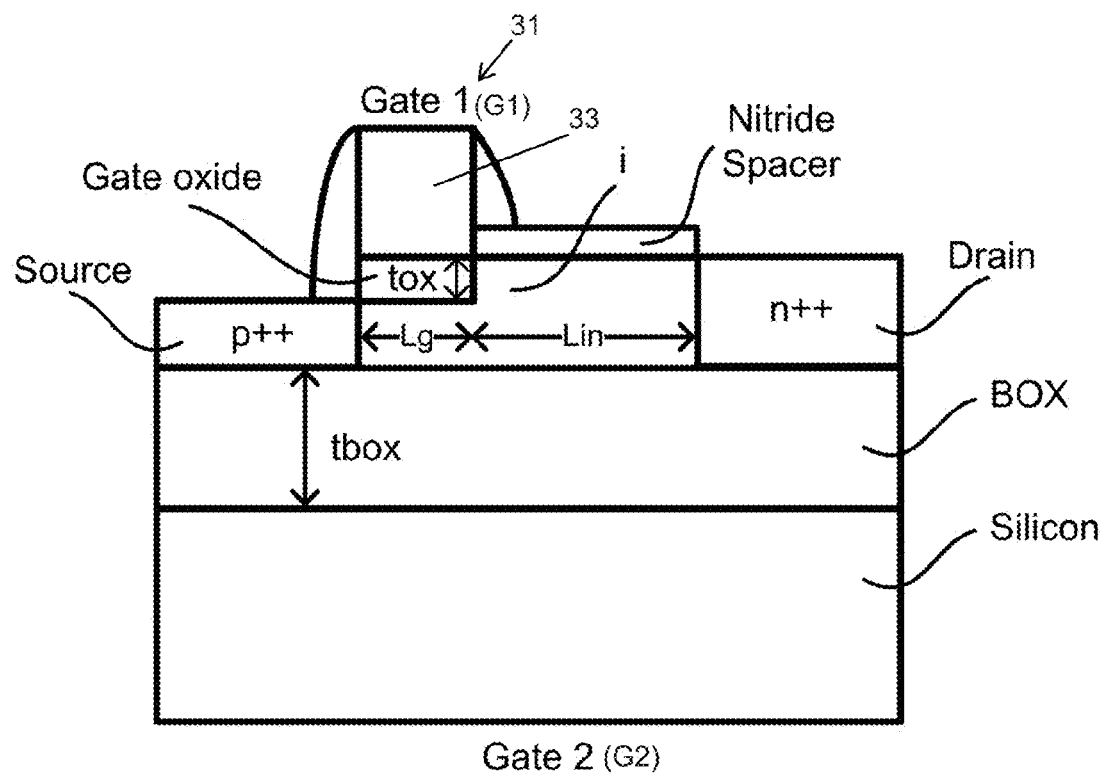
FIG. 7(a) illustrates a cross section of a planer NTFET memory device from which measurements are taken to confirm the principals of the present invention.

An experimental demonstration has been carried out using the non-optimal DG NTFET planar device structure illustrated in FIG. 7. The memory device of the present invention and operation thereof have been experimentally demonstrated. The device of FIG. 7 has been optimized for N type operation and has been fabricated by CEA-LETI/Grenoble-France [25]. The fabrication of the device was performed on an SOI substrate with a 145 nm BOX layer and a 20 nm active Si layer forming the p-i-n structure using a MESA process.

The gate stack 31 is composed of a 6 nm ($t_{ox}$) SiO$_2$ gate oxide/10 nm TiN layer/50 nm Poly Si layer 33. A Si$_3$N$_4$ protection layer is deposited and patterned to introduce intrinsic regions adjacent to the drain side. This device was particularly designed to reduce the ambipolar current by reducing the electric field at the drain side tunnel junction.

Figure 7B:
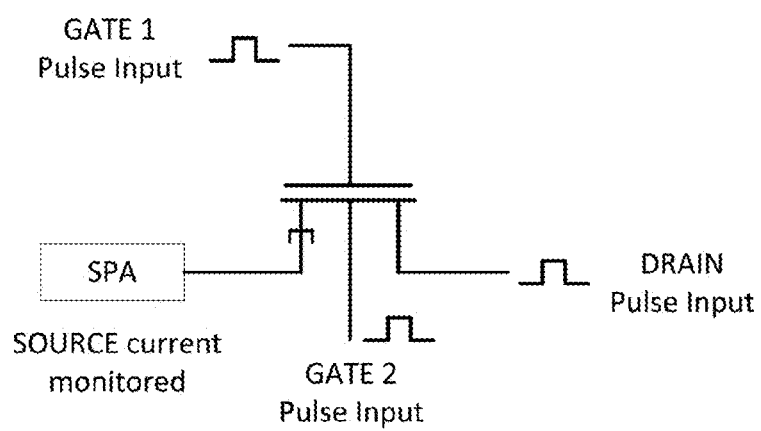
FIG. 7(b) illustrates a measurement setup showing the terminals of the device of FIG. 7(a) which were pulsed (Gate1, Gate2, Drain) and the current being sensed at the source terminal with a semiconductor parameter analyser (SPA)

The device of FIG. 7 has an asymmetric gate design, with a partial overlap of the Gate 1 (of length $L_G$) and with a total overlap of the Gate 2 over the intrinsic channel region (of length $L_G+L_{IN}$), which creates the necessary condition to store holes injected from the source-to-body junction in an electrically induced potential well near the drain as explained previously. The measurement setup is as shown in FIG. 7(b). The Gate1, Gate2 and the drain terminals were pulsed whereas the source current was monitored on an Agilent 4156C semiconductor parameter analyser.

Figure 8A:
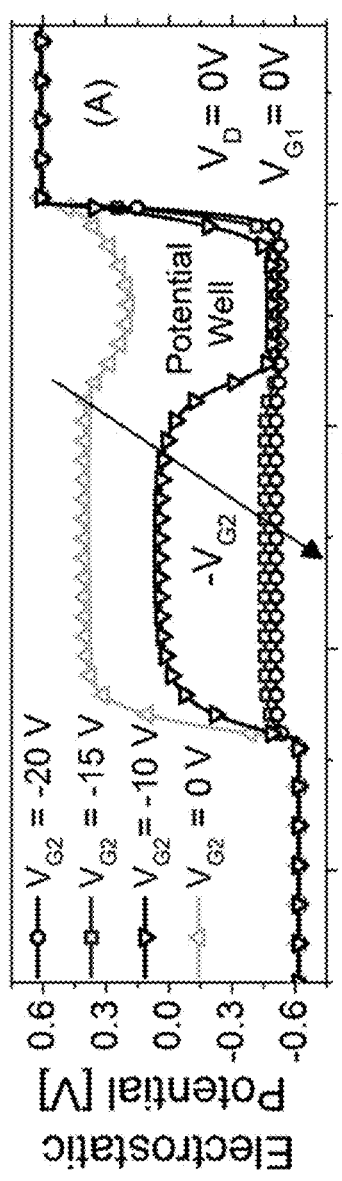
FIG. 8(A) illustrates a simulated potential profile, at 1 nm above the BOX layer of the device of FIG. 7, as a function of the second gate potential, $L_G$=400 nm where the creation of a potential well for $V_{G2}$=−10V with $L_{IN}$=200 nm.
Figure 8B:
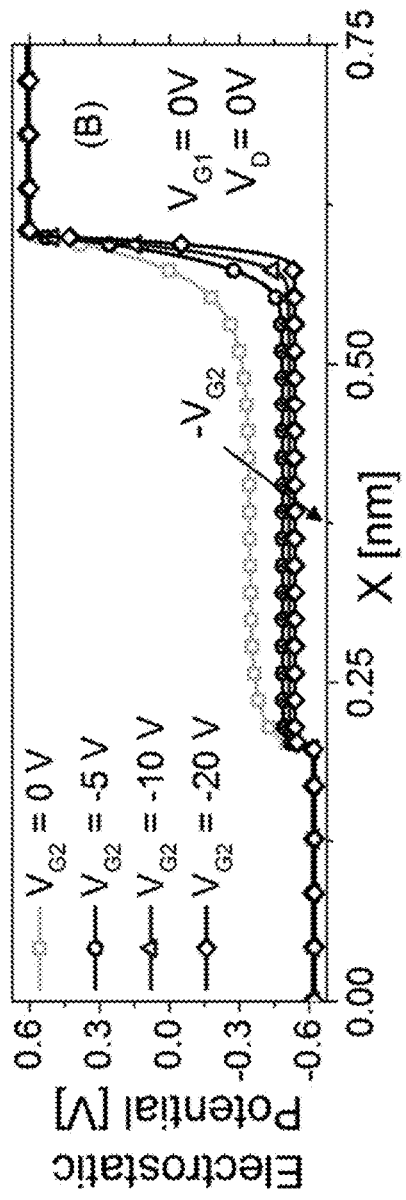
FIG. 8(B) illustrates a simulated potential profile, at 1 nm above the BOX layer of the device of FIG. 7, as a function of the second gate potential, $L_G$=400 nm with an absence of a potential well when $L_{IN}$=0 nm.

FIGS. 8(A) and (B) illustrate a simulated potential profile, at 1 nm above the BOX layer of the device of FIG. 7, as a function of the second gate potential, $L_G$=400 nm where the creation of a potential well for $V_{G2}$=−10V with $L_{IN}$=200 nm is shown in FIG. 8(A), and an absence of a potential well when $L_{IN}$=0 nm is shown in FIG. 8(B). TCAD simulation results (FIG. 8) show that the fabricated device, despite the fact that it is an non-optimized structure for the DRAM operation method of the present invention, produces a potential well under a highly negative bias on the gate Gate2, which is at least due to the thick BOX (Buried oxide) layer.

It is worth noting that an accumulation of charges under the second gate Gate2 is observed in a TFET device where the Gate 1 also totally overlaps over the channel, however, there is no pocket of charges and the carriers are quasi-instantaneously removed from the body. Hence, the principle of the memory operation method crucially depends on the presence of the potential well.

The programming scheme for the device of FIG. 7 is depicted in Table II and the timing diagrams for read/write operations are shown in FIG. 9. FIG. 9 shows measured consecutive ERASE (or WRITE-0)/READ and WRITE-1/READ operations measured from the NTFET device of FIG. 7 (with $L_G$=400 nm, $L_{IN}$=200 nm), the source current was sampled every 60 μs with a constant voltage of 500 mV and, as shown, a memory effect is observed, and based on the previous WRITE-1/ERASE (or WRITE-0) state a difference of 20 nA in the READ current ($I_S$) for states '1' and '0' is observed, where the measurements were done at two different frequencies 50 Hz and 200 Hz.

The read operation is performed with the most negative bias applied at the gate Gate2. Depending on the stored state, a clear difference in read (from source terminal) current levels ($\Delta I_S$) is observed in FIG. 9.

TABLE II

Programming conditions for indicated operations WRITE '1' and READ of the device of FIG. 7 with Lg = 400 nm, Lin = 200 nm. The ERASE also corresponds to WRITE '0'.

| State | $V_D$ [V] | $V_{G1}$ [V] | $V_{G2}$ [V] | $V_S$ [V] |
|---|---|---|---|---|
| WRITE | 1.5 | 4.5 | −10 | 0.5 |
| ERASE | 0 | 4.5 | +10 | 0.5 |
| READ | 4 | 4.5 | −10 | 0.5 |

In the measurements, biasing conditions are slightly different than what has been mentioned previously Source potential ($V_S$) is biased positively not only during write but also in erase and read because of the equipment limitations in the measurement setup. In the erase operation, the influence of positive source is partially compensated by using a highly positive gate bias at Gate2 ($V_{G2}$) while erase. In read operation, drain and first gate potentials are chosen such that the desired $V_{G1S}$ and $V_{DS}$ are applied. Another difference in the biasing scheme can be observed in $V_D$ for write operation. This has been done to avoid holes recombining at the drain side. In an optimized device structure as discussed above in relation to FIGS. 1 to 6, there is no such need for such different biasing conditions and high voltages. Finally, Gate 1 ($V_{G1}$) is biased positively in all the operation modes which is again due to the setup limitations.

The reason for the low frequency choice is based on the ON current levels of the fabricated device of FIG. 7 and the high parasitic capacitances contributions by non-optimized test pads and the test instruments.

As to outlook of scaling and bit selectivity, technology scaling has immense implications on memory scaling. The main challenge regarding the scaling of 1 transistor+1 capacitor (1T+1C) cells is the need to fit the bit cell capacitor with the same capacitance as in the preceding node into a smaller footprint in the successive generations. The concept of capacitor-less memory relinquished the capacitor challenge thanks to its entirely different operation principle. In consideration of lithographical solutions provided for feature size scaling capacitor-less memory will follow the trend, yet 1T+1C cells are provisioned to be limited by the capacitor challenge which demands introduction of new materials in the process.

Another parameter concerning memory area is the area factor which depends on the array configuration and transistor alignment. Solely scaling the feature size is not sufficient to follow the DRAM cell size trend predicted by ITRS (International Technology Roadmap for Semiconductor) hence smaller area factor is required which eventually is limited to $4F^2$ (F being a pitch distance for a given technology node). Both classes (with and without capacitor) of memory cell achieved $6F^2$ area per bit cell with lateral structures or with recessed channel in the most recent technology nodes. Introduction of vertical transistor and capacitor stacking is being developed to reduce the area factor to 4, in which the high aspect ratio of the storage capacitor raises as the biggest challenge again and brings reliability issues.

The device 1 of the present invention and a memory cell according to the present invention requires 4 control signals; consequently the area factor is higher than MOSFET based floating body memory cells. However elimination of the capacitor component from the cell reduces the process complexity and cost and makes it promising for next generation memories.

Figure 10:
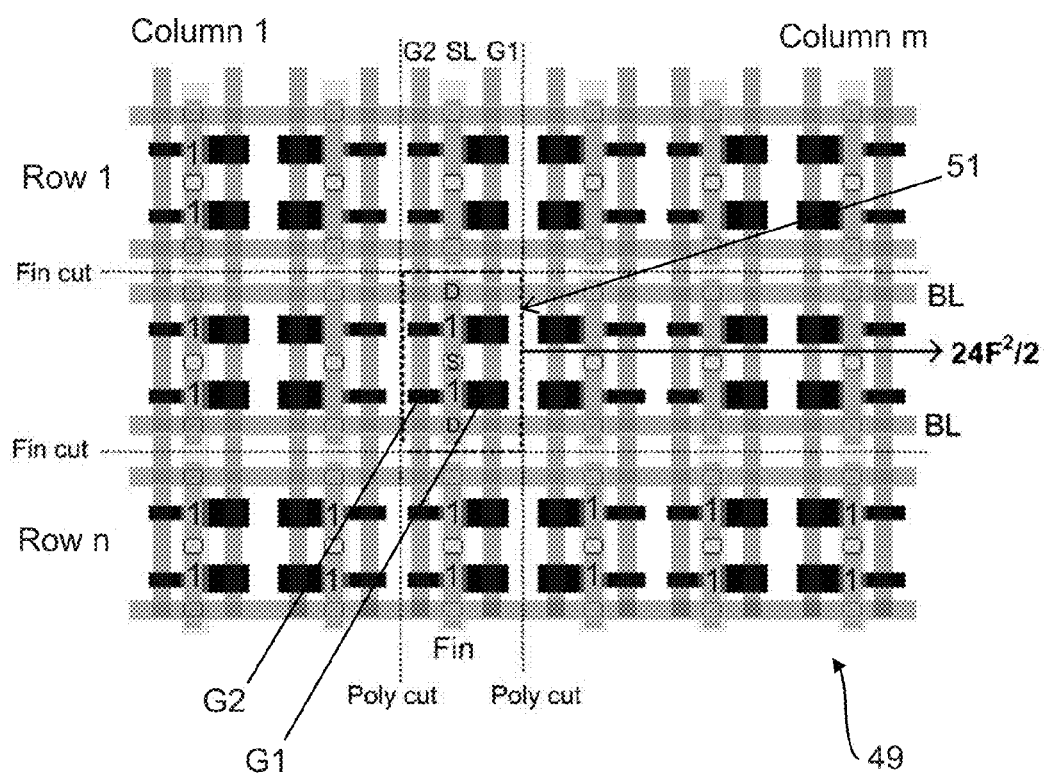
FIG. 10 illustrates a memory array composed of a plurality of the devices according to the present invention that form a 1T TFET based memory cell.

An array 49 configuration of cells (bit-cells) including the device 1 according to the present invention is shown in FIG. 10. The illustrated array 49 contains 18×2 devices 1 according to the present invention. A cell 51 includes at least one device 1. The cell 50 of FIG. 13 includes two devices 1 having a common source region S (and source terminal).

Since the formation of the potential well strictly depends on the gate G2 potential, a gate G2 communication line (connected to the gate G2 terminals of the devices cells) has to be shared along each column, bit cells of which are accessed simultaneously. Thus, G1 and G2 communication lines are routed in the same direction as the fin structures. Bit lines BL (connected to drain terminals D of the cells) are connected in the orthogonal axis with respect to fin structures with a first metal connection metal-1 above poly-Si, thus for source line connections SL which are routed in the same direction as the fin structures a higher metal layer connection (metal-2) above metal-1 is required.

If G1 and G2 communication lines are routed with poly-Si, and the poly-Si and metal pitch are assumed to be equal, the area per bit cell can be approximated as $12F^2$.

When a bit cell 51 is accessed for a read operation, bias voltages of Bit line BL and G1 communication line-connected to the selected cell are increased. As the selected bit line BL bias voltage increases, the cells in the unselected columns which share the same selected bit line BL communication line are disturbed, especially cells storing a state '1'. To prevent data loss in the unselected bit cells, the BL communication line potential of the selected cell in read mode should not be high such that the unselected cells lose their content, because sufficiently high drain potential can cause holes which are stored in the potential well to be lost even though their G2 communication lines are biased negatively as determined for hold mode. To program a column, first all cell bits are erased by biasing gate G2 at zero or positively. Then, to program certain bits to a state '1' selectively, the bit line BL of the cells which are to remain at state-0 are increased in voltage bias such that when the source line connection SL bias voltage increases, their drain-source voltage becomes zero. The lack of electrical field in the source-drain direction prevents hole accumulation in their potential well. When gate G2 communication line is taken to a negative bias, only cells 51 which have negative drain-source voltages will be written. Further area optimization can be done by using higher metal layers.

Single transistor concept dates back to 1970s [0, 0, 0]. Since then various methods of writing and reading from the 1T memory cell have been proposed.

In summary, the methods to write "1" which indicates, for example, an accumulation of holes in the body are:
1. Impact ionization by MOSFET current
2. Impact ionization by intrinsic bipolar current [0]
3. Gate induced drain leakage mechanism (band-to-band tunneling) [0,0,0]
4. Extrinsic bipolar current [0]
5. Carrier drift action, MOSFET operation [0]

Each method has their advantages and shortcomings which majorly concerns reliability, write "1" selectivity, power and area.

The methods for write "0" can be grouped as:
1. P-N forward bias with Bit Line (BL) minus [0,0,0,0,0]
2. P-N forward bias with Source Line (SL) and Word Line (WL) minus [0]
3. P-N forward bias with SL minus [0]
4. P-N forward bias with BL plus [0]
5. P-N forward with BL plus and WL 0V
6. P-N forward with BL and back word line plus [0, 0, 0]
7. Charge pumping [0]
8. Gate direct tunneling [0]

So far proposed methods for read operation in a capacitorless dram cell are:
1. MOSFET current [0]
2. Bipolar current [0]
3. Carrier drift action (forward biased diode current) with feedback [0]

The write "1" operation of the device 1 and 1T TFET memory cell of the present invention is based on forward bias current with, for example, Gate 2 (G2) negative (see for example, FIG. 1) and SL positive. In the prior art, only [0] relies on carrier drift (forward biased diode action) due to applied electric field. However in [0] the charge differentiating the logic states is stored in a capacitor created by negatively biased front (control gate in read operation) gate. Depending on the presence of the charges stored under the front gate, the feedback mechanism kicks in or not (FBFET [0]) when the device is turned on for read. Whereas, in the device 1 of the present invention and a TFET based 1T DRAM cell according to the invention, the storage capacitor (potential well) is created for example under the negatively biased second gate G2 (not the control gate in read operation). The stored charges cause a threshold shift and modulate the drain current in readout.

The erase operation according to the present invention is performed with gate G2 at 0V or positive bias. This condition is sufficient to extract the holes from the body/channel. The erase operation can be accelerated with a negatively biased SL.

In the prior art, a read operation is based on either MOSFET current or bipolar current or carrier drift (MOSFET current) with feedback. The read operation according to the present invention is in contrast based on band to band tunneling (BTBT) current. Thanks to the weak dependence of the tunneling current on temperature, read access time is insensitive to temperature variations. Moreover, the drain current is well controlled with the front gate G1 since tunnel FETs are prominent for their steep switching behaviour and well predicted ON current [0].

When the device 1 and memory cell of the present invention and its method of operation is compared with the prior art, it is particularly noted that a DRAM device 1 using BTBT as a memory Read operation/mechanism is until now unknown. Moreover, a DRAM device 1 using BTBT as a memory Read operation/mechanism together with carrier drift (forward biased diode action) as a memory Write operation/mechanism is also unknown in the prior art and permits the device reliability and lifetime to be improved.

As previously mentioned, the present invention equally applies to a P-type device, that is, the source region 3 is (doped) n-type and the drain region is (doped) p-type. Device operation comprises an inversion of the applied voltage bias compared to that of the N-type device. For instance, generating a potential well for storing charge carriers is carried out by biasing the gate G2 with a positive voltage. A write '1' operation is carried out by applying a negative bias to the source region to forward bias the source region/intrinsic channel region junction to provide charge carriers to the generated potential well. The write '0' operation is carried out by applying a zero bias or negative bias to the gate G2. During a holding operation, a zero bias is applied to the source region and a positive bias to the gate G2 to hold any excess charge. A reading operation is equally carried out using band to band tunneling BTBT of carriers from the source region to the intrinsic channel region and by applying a device operating voltage $V_{DD}$ to the drain region and the gate G1 at a value permitting bending of the energy bands such that tunneling occurs at the source channel junction beneath the gate G1.

Figure 11A:
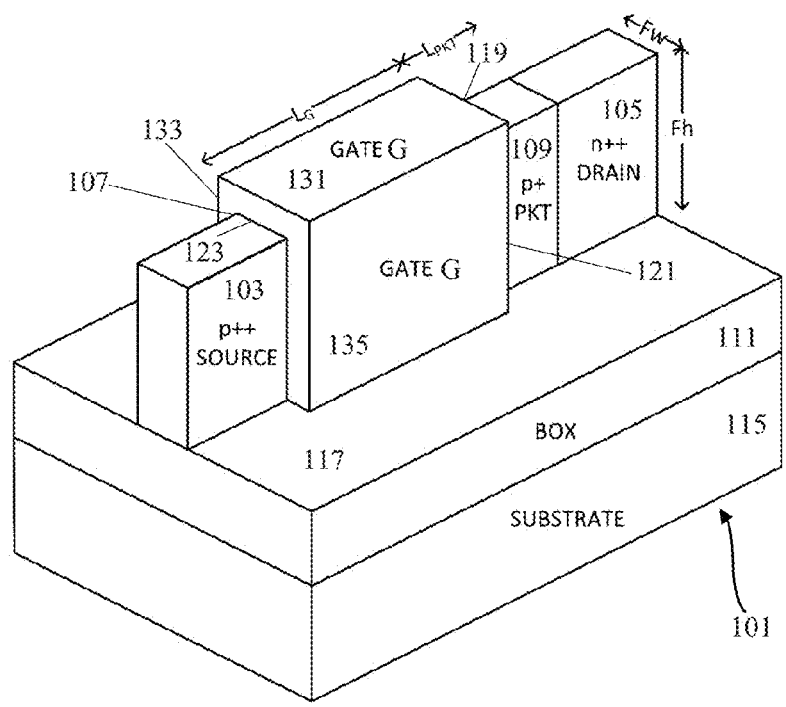
FIG. 11(a) shows a 3D schematic of a device structure according to another embodiment of the present invention including a p+ doped pocket between the channel and drain.

Fin-TFET with Doped Pocket Structure:

FIG. 11(a) shows a device 101 according to another aspect of the present invention.

The device 101 is a three dimensional tri-gate FIN N-type Tunnelling Field Effect Transistor structure. The device 101 includes a non-planar transistor built on an SOI or silicon substrate, that is, a FIN transistor built on an SOI or silicon substrate.

The device 101 includes a fin structure (FIN) and the device 101 is a non-planer structure. The fin structure comprises a source region 103, a drain region 105, an intrinsic channel region 107 between the drain region 105 and the source region 103. The device 101 further includes a p-type doped potential well/carrier pocket section 109 that interconnects the channel 107 to the drain 105. The potential well/carrier pocket section 109 defines or generates a potential well for storing mobile charge carriers to permit memory operation of the device 101.

The intrinsic channel region 107 is connected to the source region 103 and the potential well/carrier pocket section 109. The device 101 also includes a gate G connected to the intrinsic channel region 7 for transistor or device control.

The device 101 further includes a BOX (Buried oxide) layer 111 from which the fin structure projects outwardly, and a substrate 115 comprising a silicon (Si) layer or a silicon on insulator (SOI) layer (Si/insulator/Si substrate).

The source 103, channel 107, the potential well/pocket section 109 and the drain 105 all project outwardly from the device upper surface 117 and are raised above the surface 117 of the BOX layer 111. The fin structure extends out from the surface 117 of the BOX layer 111 to form a structure protruding from a base that is the BOX layer 111. In the exemplary embodiment, the device has a substantially inverted 'T' shape to which gate G, having a substantially 'U' shape, is saddling the fin structure FIN.

The channel 107 extends outwardly from the Box layer 111 and includes a first face 119 and a second face 121, each of which is substantially perpendicular to the surface 117 of the BOX layer 111. The first 119 and second face 121 are substantially parallel to each other. The channel 107 further includes a top surface 123 interconnecting the first 119 and second face 121. The top surface 123 extends substantially parallel to the surface 117 of the BOX layer 111.

The gate G is a tri-gate. The gate G comprises a base 131, a first arm 133 and a second arm 135 where the first and second arms extend outwardly from and substantially perpendicular to the base 131. The cross-sectional shape of the gate G is substantially U-shaped.

The first arm 133 of Gate G is connected to the first face 119 and substantially fully covers the first face 119 of the channel. The second arm 135 is connected to the second face 121 and also substantially fully covers the second face 121 of the channel 107. The top surface 123 of the channel 107 is also substantially fully covered by the base 131 of gate G. A thin gate oxide layer (not-illustrated) is present between the gate G and the first face 119 of the channel 107, between the gate G and the second face 121 of the channel 7 as well as between the Gate G and the top surface 123.

The gate G is preferably symmetric in shape and/or length and fully covers the channel 107. However, the gate G can also be asymmetric, that is the arms 133, 135 of the gate G can be of different lengths $L_G$.

In the illustrated embodiment, the channel 7 has a length that extends in a direction interconnecting the source region and the potential well section 109. The gate G has a length $L_G$ that is substantially the same as the length of the channel 7 and fully encloses the channel 107.

The device 101 of FIG. 11(a) is an N-type device, that is, the source region 3 is doped p-type, the potential well/pocket section 109 is doped p-type and the drain region is doped n-type. However, it should be understood that the present invention equally applies to a P-type device, that is, the source region 3 is doped n-type, the potential well/pocket section 109 is doped n-type and the drain region is (doped) p-type.

The device 101 can also be formed as a vertical structure such as that illustrated in FIG. 5 but to which a potential well/pocket section 109 is present between the channel and the drain region and where a gate fully or partially encloses the intrinsic channel.

Figure 11B:
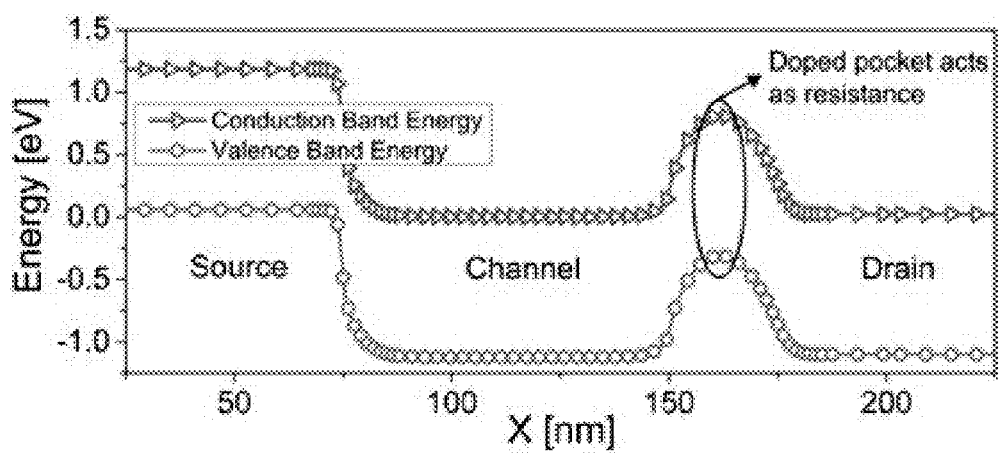
FIG. 11(b) shows an energy band diagram at steady state showing the doped pocket acting as a series resistance to the flow of carriers from the source to the drain.
Figure 12A:
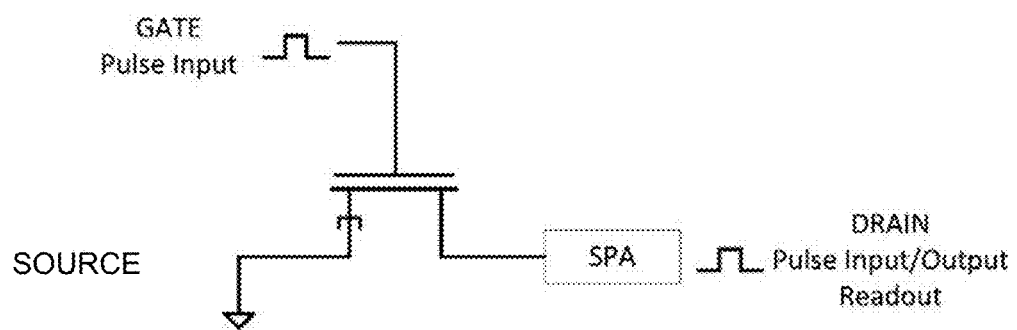
FIG. 12(a) illustrates a connection setup showing the terminals of the device of FIG. 11(a) which are biased and where a read current is sensed for the results presented in FIGS. 13(a) and (b) as well as FIGS. 14(a) and (b)
Figure 12B:
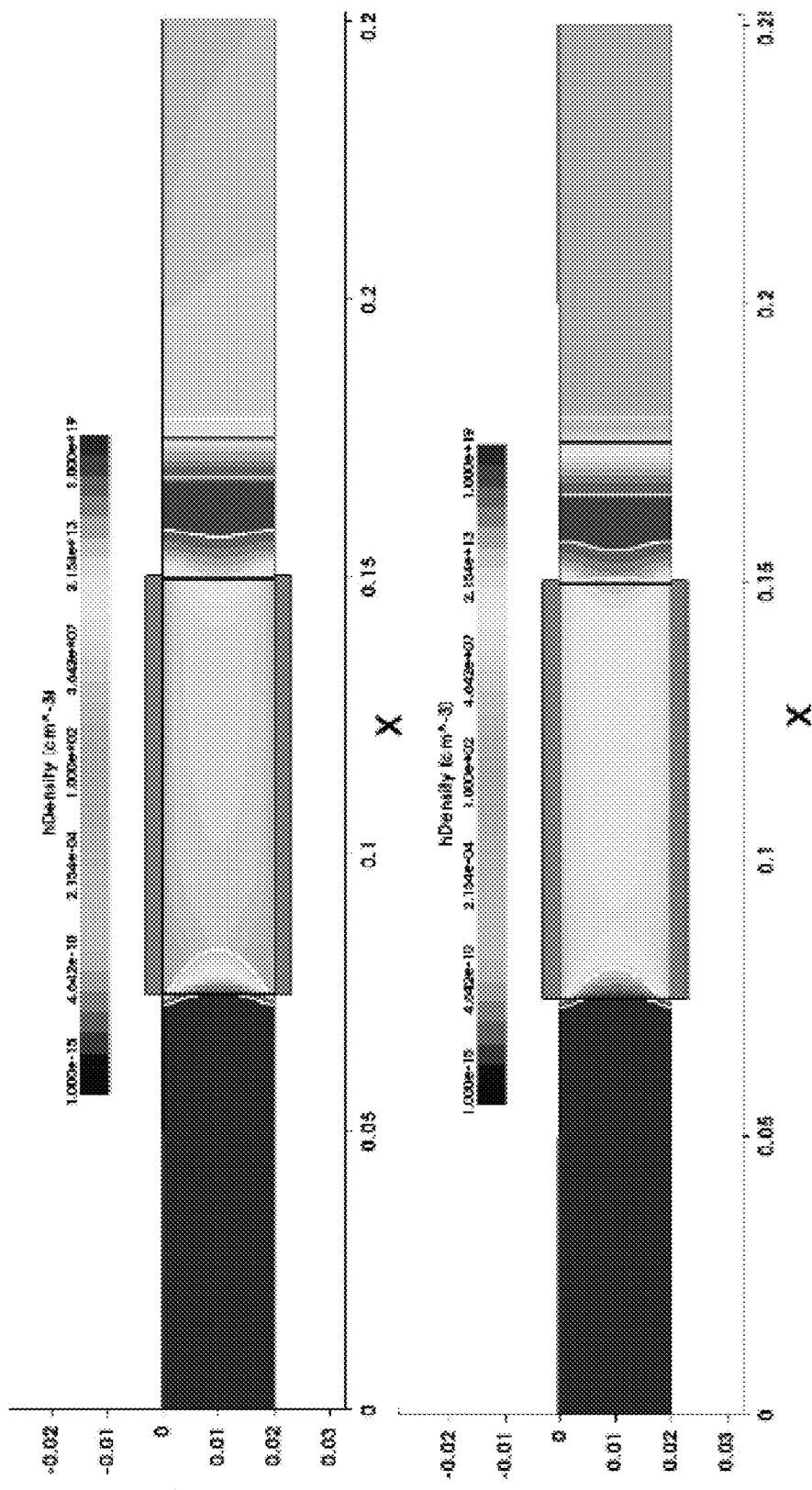
FIG. 12(b) illustrates the results of a hole density TCAD calculation of a 2D cross-section of the device structure of FIG. 11(a) showing the hole density at a HOLD state after a WRITE "1" operation (top), and after a WRITE "0" operation (bottom)

FIG. 11(b) shows the energy band diagram of the device 101 of FIG. 11(a). The potential well section/doped pocket section 109 acts as a resistance to the flow of carriers between the source region 103 and the drain section 105 and the drain bias is used to control this resistance to the current flow.

The tri-gate Fin-TFET device 101 as shown in FIG. 11(a) can be fabricated on both bulk as well as SOI wafers 115. A source/drain doping of $1 \times 10^{20}$ cm$^{-3}$ of Boron/Arsenic was used. The channel is an intrinsic channel or lightly doped. A 3 nm layer of $HfO_2$ gate oxide was used between the gate G and the outer surfaces of the channel 107.

The potential well/pocket section 109 is of length $L_{PKT}$=25 nm and is p-type doped at a value $N_{PKT}$=5×10$^{18}$ cm$^{-3}$ to enable optimum functioning of the memory cell device 101. A higher pocket doping results in a deeper potential well as well as a higher resistance for carriers resulting in lower currents. A lower doping on the other hand requires a very high drain bias for memory operation, which is not feasible for a $L_G$=100 nm gate length device. In the calculations to verify the memory operation of the device 101, abrupt doping profiles were assumed and the calculations/simulations were carried out for a 2D cross-section of the device 101 of FIG. 11(a).

FIG. 11(a) shows the terminal connections to the device 101 used for the simulations. FIG. 11(b) shows the results of a TCAD simulated 2D cross-section of the device 101 showing the hole density at a HOLD state after a WRITE "1" operation (top) and after a WRITE "0" operation (bottom).

The following is a memory operation method of the device 101 of FIG. 11(a) according to the present invention.

Figure 13A:
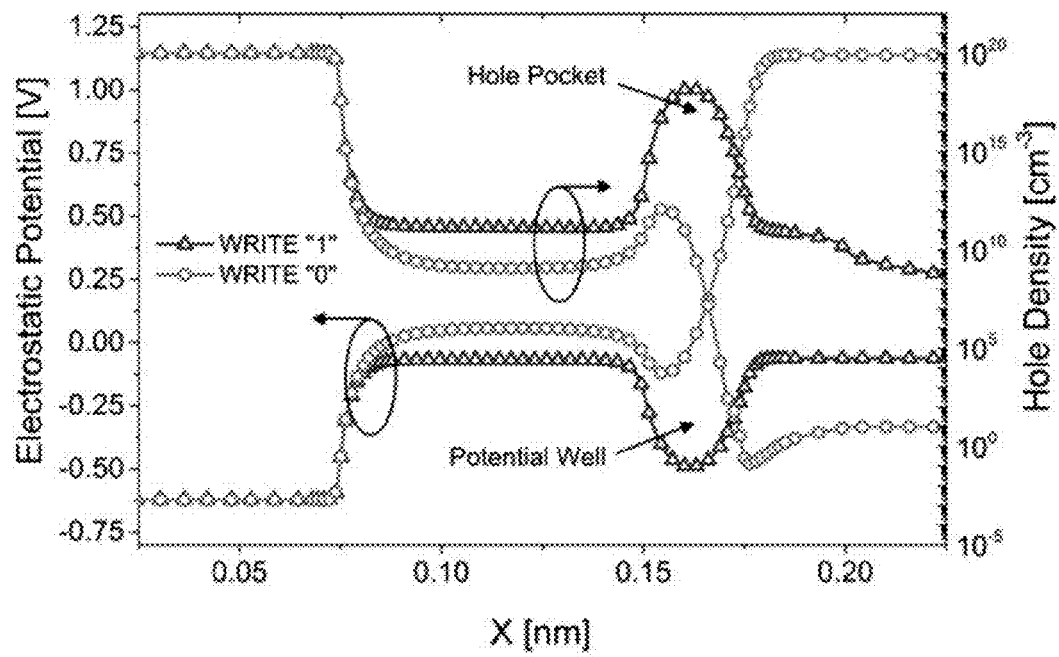
FIG. 13(a) shows a simulated potential profile and hole density at 3 nm below the gate oxide/channel interface and in the intrinsic channel of the device of FIG. 11(a) after a WRITE "1" and WRITE "0" state.

FIG. 13(a) shows the simulated hole densities at the end of a WRITE "1" operation and at the end of a WRITE "0" operation. It is evident from this FIG. 13(a) that the hole density in the pocket area after a WRITE "1" operation is a lot higher than after a WRITE "0" operation. This is similarly reflected in the potential profiles of FIG. 13(b) as well. When the device turns ON, after these two states a difference in drive current is obtained, which forms the basis of the memory operation of device 101. It is to be noted that the memory state reading operation is carried out using band to band tunneling of carriers from the source region to the intrinsic channel region in this case as well.

(DRAM) Operation Method:

TABLE III memory operation method for device 101

| State | $V_D$ (Drain bias voltage) [V] | $V_G$ (Gate G bias voltage) [V] | $V_S$ (Source bias voltage [V] |
|---|---|---|---|
| WRITE 1 | Negative bias to attract holes into the pocket | Small positive values To aid the write process | 0 |
| WRITE 0 (ERASE) | (High) positive bias to clear charges from the pocket | Small positive values To aid the write process | 0 |
| HOLD | 0 | Slightly higher positive bias to hold charges in the pocket. | 0 |
| READ | $V_{DD}$ | $V_{DD}$ | 0 |

The memory operation method (or programming scheme) of the device 101 of the present invention is depicted in the above Table III. More specific exemplary values are given in Table IV below.

Figure 13B:
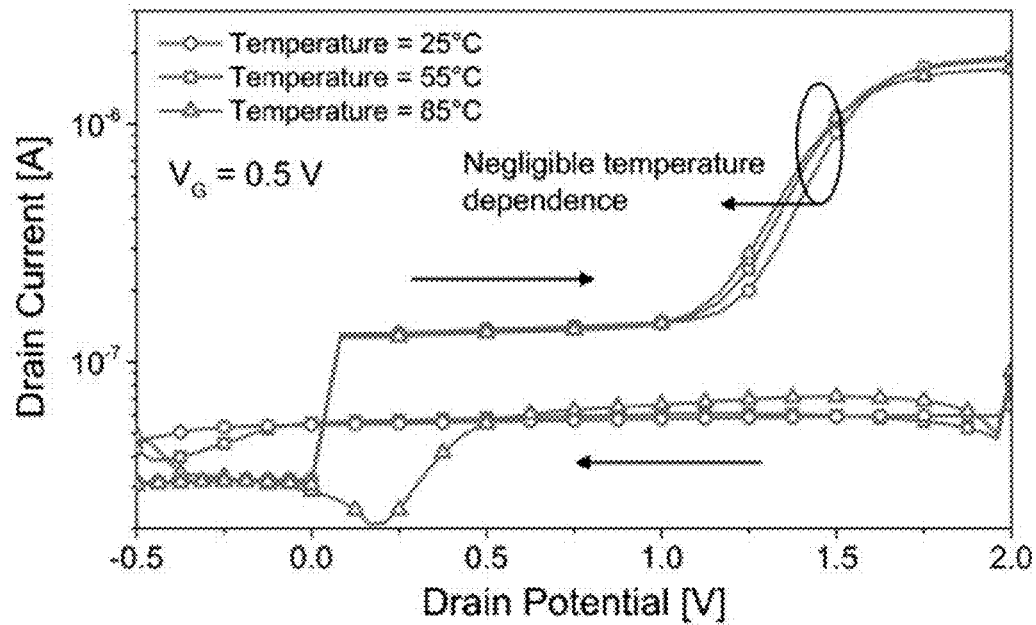
FIG. 13(b) shows, for the device of FIG. 11(a), simulated hysteresis curves for drain current with respect to drain potential at 25° C., 55° & 85° C.

The effect of a back and forth sweep of the control drain bias is used to study the hysteresis effect (FIG. 13(b)). As shown in FIG. 13(b), a significant difference of ~900 nA is observed at an applied bias to the drain of $V_D$=1.5V between the two READ currents. FIG. 13(b) also shows the same curves at elevated temperatures of 55° C. and 85° C. A minimal temperature dependence was observed.

Figure 14A:
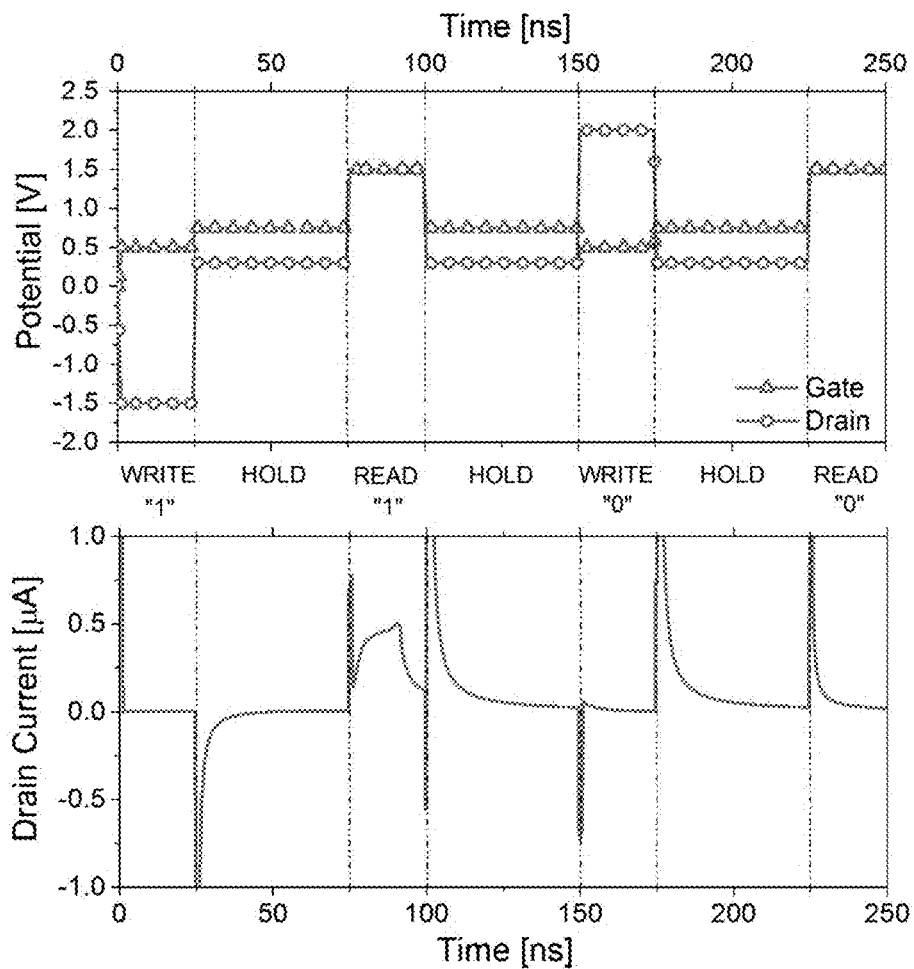
FIG. 14(a) shows, for the device of FIG. 11(a), a continuous read/write cycle with hold time in between, where a difference of 500 nA is observed between the two memory states.

The timing diagrams for READ, HOLD and WRITE operations and the corresponding calculated drain current is shown in FIG. 14(a). Depending on the previous stored state, a clear difference in READ current levels ($\Delta I_D$=500 nA) is observed.

Figure 14B:
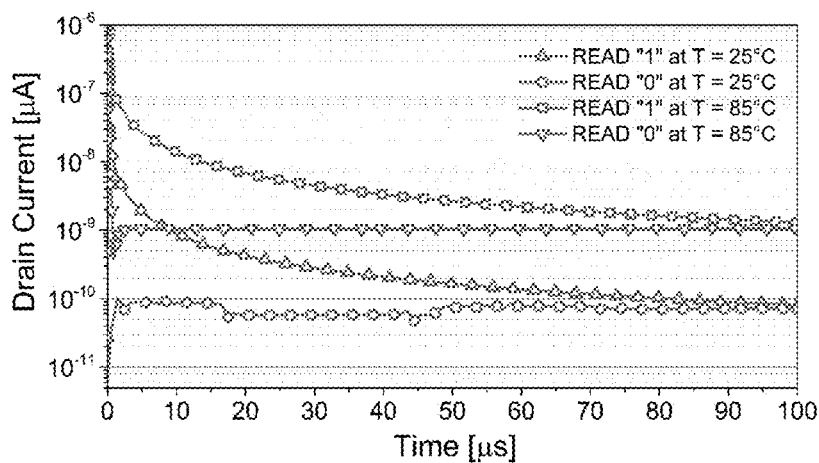
FIG. 14(b) shows charge relaxation time of the proposed memory cell device of FIG. 11(a) at 25° C. & 85° C.

FIG. 14(b) shows the charge relaxation of the memory cell device 101. A charge relaxation time in the order of 100 μsec was observed for the simulated device. There is room for improvement to extend charge relaxation time as process and device technologies advance. The same FIG. 14(b) also shows the charge relaxation at an elevated temperature of 85° C. It is to be noted that the charge relaxation time is not degrading with increasing temperature, which is related to the TFET sub-threshold swing temperature stability.

TABLE IV memory operation method for device 101

| State | $V_D$ (V) | $V_G$ (V) | $V_S$ (V) |
|---|---|---|---|
| WRITE "1" | −1.5 | 0.5 | 0 |
| WRITE "0" | 2.0 | 0.5 | 0 |
| HOLD | 0 | 0.75 | 0 |
| READ | 1.5 | 1.5 | 0 |

Having now described the preferred embodiments of this invention, it will be apparent to one of skill in the art that other embodiments incorporating its concept may be used. It is felt, therefore, that this invention should not be limited to the disclosed embodiments, but rather should be limited only by the scope of the appended claims.

The invention claimed is:

1. A single field effect transistor capacitor-less memory device including:
   a drain region;
   a source region;
   an intrinsic channel region between the drain region and the source region forming the single field effect transistor;
   a base;
   wherein the device further includes:
   a fin structure (FIN) comprising the source region, the intrinsic channel and the drain region, the fin structure extending outwardly from the base; and
   a double gate comprising a first gate (G1) connected to a first exposed lateral face of the intrinsic channel region for transistor control, and a second gate (G2) connected to a second exposed lateral face of the intrinsic channel region to generate a potential well for storing mobile charge carriers permitting memory operation, the first gate (G1) and the second gate (G2) being independent and asymmetric gates with respect to each other for asymmetric electrostatic control of the device.

2. A memory operation method of the device according to claim 1, the method including the step of:
   generating a potential well for storing mobile charge carriers permitting memory operation by applying a first biasing voltage to the second gate (G2).

3. The method according to claim 2, further including the step of:
   carrying out a first write operation of a first memory state using a forward bias diode action of carriers drifting into the potential well.

4. The method according to claim 3, wherein the first write operation is carried out by applying a second bias voltage to the source region to forward bias the source region/intrinsic channel region junction to provide charge carriers to the generated potential well.

5. The method according to claim 4, further including the step of:
   carrying out a memory state holding operation by applying a zero bias to the source region and a hold voltage of the same sign as that of the first biasing voltage to the second gate (G2) to hold any excess charge.

6. The method according to claim 3, further including the step of:
   carrying out a memory state reading operation using band to band tunneling (BTBT) of carriers from the source region to the intrinsic channel region.

7. The method according to claim 6, wherein the reading operation is carried out by applying a positive device operating voltage ($V_{DD}$) to the drain region and to the first gate (G1) at a value permitting bending of the transistor energy bands such that tunneling occurs at the source-channel junction beneath the first gate (G1).

8. The method according to claim 2, further including the step of:
carrying out a second write operation of a second memory state or an erase operation by applying a zero bias or a third bias voltage opposite in sign to that of the first biasing voltage to the second gate (G2) to remove the generated potential well.

9. The method according to claim 2 wherein generating a potential well for storing mobile charge carriers permitting memory operation is carried out by biasing the second gate (G2) in an accumulation mode of operation while biasing the first gate (G1) in an inversion mode of operation and/or a depletion mode of operation.

10. A memory cell including the device according to claim 1.

11. A memory cell array including the device according to claim 1.

12. A single field effect transistor capacitor-less memory device including:
a drain region;
a source region;
an intrinsic channel region between the drain region and the source region (103) forming the single field effect transistor;
a base;
wherein the device further includes:
a carrier potential well section, connected between the intrinsic channel region and the drain region, for storing mobile charge carriers permitting memory operation, the carrier potential well section being a doped pocket region forming a permanent potential well between the intrinsic channel region and the drain region for storing the mobile charge carriers permitting memory operation;
a fin structure (FIN) comprising the source region, the intrinsic channel, the carrier potential well section and the drain region, the fin structure extending outwardly from the base; and
a tri-gate (G) straddling the intrinsic channel region for electrostatic control of the device.

13. A memory operation method of the device according to claim 12, the method including the step of:
carrying out a first write operation of a first memory state by applying a first bias voltage to the drain region and a second bias voltage of opposite sign and smaller magnitude than that of the first bias voltage to the tri-gate to populate a potential well with mobile charge carriers.

14. The method according to claim 13, further including the step of:
carrying out a second write operation or an erase operation by applying a third bias voltage opposite in sign to that of the first biasing voltage to the drain and a fourth bias voltage of opposite sign and smaller magnitude than that of the third bias voltage to the tri-gate to remove mobile charge carriers.

15. The method according to claim 13, further including the step of:
carrying out a memory state holding operation by applying a zero bias to the drain region and a hold voltage of the same sign as that of the third biasing voltage but higher in magnitude than the third biasing voltage to the tri-gate (G2) to hold charge carriers in the potential well.

16. The method according to claim 13, further including the step of:
carrying out a memory state reading operation using band to band tunneling (BTBT) of carriers.

17. The method according to claim 16, wherein the reading operation is carried out by applying a positive device operating voltage ($V_{DD}$) to the drain region and to the tri-gate (G) at a value permitting bending of the transistor energy bands such that tunneling occurs.

18. The device according to claim 12, wherein the doped pocket region is a p+ region between the intrinsic channel region and the drain region that is an n+ region, or the doped pocket region is an n+ region between the intrinsic channel region and the drain region that is a p+ region.

19. A memory cell including the device according to claim 12.

20. A memory cell array including the device according to claim 12.

* * * * *